(12) United States Patent
Ijitsu

(10) Patent No.: US 7,446,589 B2
(45) Date of Patent: Nov. 4, 2008

(54) PULSE GENERATION CIRCUIT

(75) Inventor: Kenji Ijitsu, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 11/319,729

(22) Filed: Dec. 29, 2005

(65) Prior Publication Data

US 2006/0097768 A1 May 11, 2006

Related U.S. Application Data

(63) Continuation of application No. PCT/JP03/10295, filed on Aug. 13, 2003.

(51) Int. Cl.
*G05F 1/04* (2006.01)
*H03K 3/00* (2006.01)

(52) U.S. Cl. ................. 327/299; 327/112

(58) Field of Classification Search ......... 327/291, 327/299, 292–298, 172, 174, 333, 55, 112, 327/108
See application file for complete search history.

(56) References Cited

U.S. PATENT DOCUMENTS

| | | | | |
|---|---|---|---|---|
| 4,843,264 | A * | 6/1989 | Galbraith | 327/55 |
| 4,973,864 | A * | 11/1990 | Nogami | 327/55 |
| 5,929,684 | A | 7/1999 | Daniel | |
| 6,477,097 | B2 | 11/2002 | Inoue | |
| 6,617,902 | B2 | 9/2003 | Tokumasu et al. | |
| 6,791,392 | B2 * | 9/2004 | Maejima et al. | 327/333 |
| 2004/0061542 | A1 * | 4/2004 | Osame et al. | 327/291 |
| 2005/0156652 | A1 * | 7/2005 | Rao et al. | 327/333 |
| 2005/0237098 | A1 * | 10/2005 | Park | 327/291 |

FOREIGN PATENT DOCUMENTS

| | | |
|---|---|---|
| JP | 04-239810 | 8/1992 |
| JP | 05-218824 | 8/1993 |
| JP | 08-237083 | 9/1996 |
| JP | 10-215155 | 8/1998 |
| JP | 11-136098 | 5/1999 |

(Continued)

OTHER PUBLICATIONS

Notice of Reason for Rejection issued Feb. 5, 2008 in Japanese Patent Application No. 2005-507745 (2 pages) (2 pages of English translation).

*Primary Examiner*—Quan Tra
(74) *Attorney, Agent, or Firm*—Staas & Halsey LLP

(57) ABSTRACT

Pulse generation circuit has a P-MOS transistor having a drain electrode connected to a first power source; a first N-MOS transistor having a drain electrode connected to the source electrode of the P-MOS transistor; a second N-MOS transistor having a drain electrode connected to the source electrode of the first N-MOS transistor, a gate electrode receiving an input pulse signal, and a source electrode connected to the second power source; a delay circuit having an input terminal connected to the source electrode of the P-MOS transistor and the drain electrode of the first N-MOS transistor and an output terminal connected to gate electrode of the P-MOS transistor and gate electrode of the first N-MOS transistor; an inverter input connected to the source electrode of the P-MOS transistor and the drain electrode of the second N-MOS transistor for outputting a generated pulse; and a keeper keeping voltage level to the inverter.

11 Claims, 23 Drawing Sheets

FOREIGN PATENT DOCUMENTS

| | | |
|---|---|---|
| JP | 2000-188528 | 7/2000 |
| JP | 2001-094404 | 4/2001 |
| JP | 2002-016482 | 1/2002 |
| JP | 2002-300010 | 10/2002 |
| JP | 2003-133916 | 5/2003 |

* cited by examiner

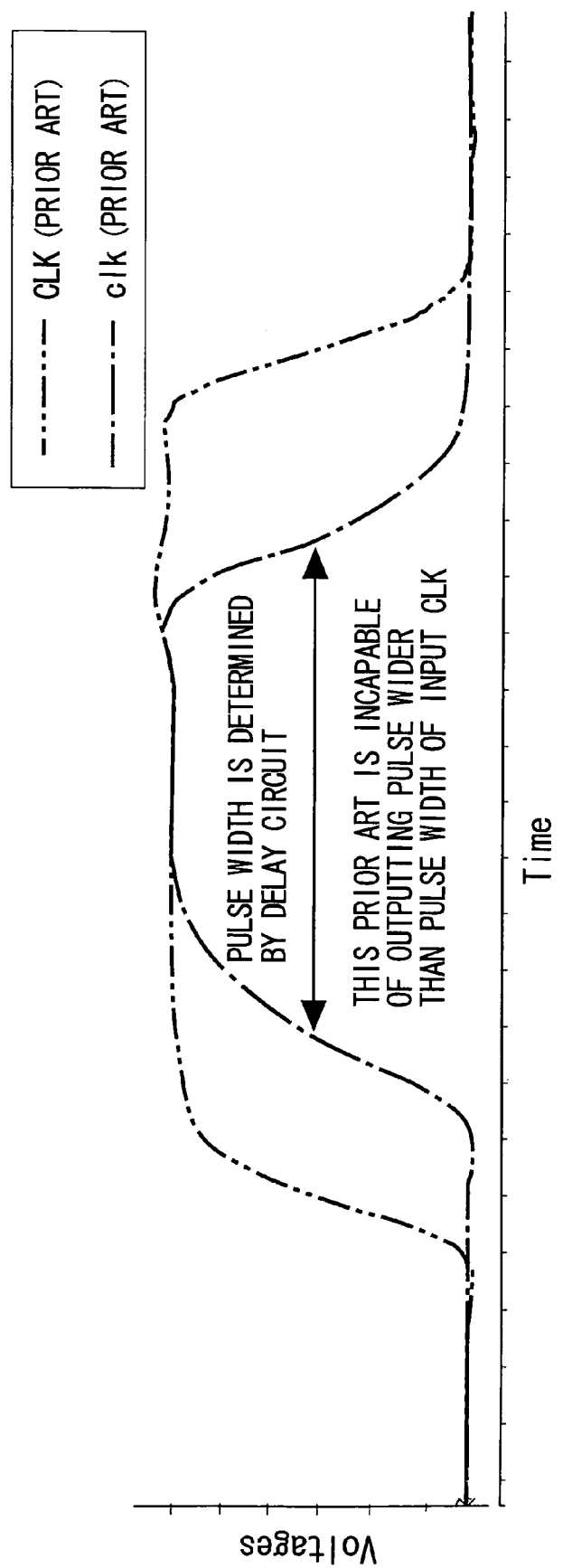

US 7,446,589 B2

PULSE GENERATION CIRCUIT

CROSS-REFERENCE TO RELATED APPLICATION

This is a continuation of Application PCT/JP2003/010295, filed on Aug. 13, 2003, now pending, the contents of which are herein wholly incorporated by reference.

BACKGROUND OF THE INVENTION

The present invention relates to a pulse generation circuit applied to generation etc. of a pulse of a clock in a circuit such as an LSI.

FIGS. 18 through 21 are diagrams each showing an example of a conventional pulse generation circuit. The pulse generation circuit shown in FIG. 18 is constructed of a 2-input NAND circuit 11, a delay circuit 12 consisting of inverters provided at odd-numbered stages, and an inverter 13. When an input pulse signal (positive pulse) is inputted to this pulse generation circuit, this pulse is inputted to one input of the NAND circuit 11, and a negative pulse with a predetermined delay is inputted to the other input of the NAND circuit 11 via the delay circuit 12. Accordingly, an output of the NAND circuit 11 is kept at a Lo-level during a period from a rise of the pulse signal inputted from an input line CLK down to a fall of the output pulse of the delay circuit 12, and hence the inverter 13 inverts this pulse, thereby generating a pulse clk. Namely, this pulse generation circuit functions as a so-called chopper that sets the input pulse signal to a pulse width corresponding an amount of the delay.

Further, the pulse generation circuit shown in FIG. 19 is constructed of a 2-input NOR circuit 14, a delay circuit 16 consisting of inverters provided at even-numbered stages, and an inverter 13. When an input pulse signal CLK is inputted to this pulse generation circuit, this pulse is inputted to one input of the NOR circuit 14, and a pulse with a predetermined delay is inputted to the other input of the NOR circuit 14 via the delay circuit 16. Accordingly, an output of the NOR circuit 14 is kept at the Lo-level during a period from a rise of the input pulse signal down to a fall of the output pulse of the delay circuit 16, so that the inverter 13 inverts this, thereby generating a pulse. Namely, this pulse generation circuit functions as a so-called extender that elongates (extends) a pulse width of the input pulse signal by an amount of the delay.

Without being limited to these static type pulse generation circuits, as shown in FIG. 20, there is also proposed a dynamic type pulse generation circuit, wherein a keeper 15 keeps a level from a rise of the input pulse signal CLK to a rise of an output pulse of a delay circuit 21, thus generating a pulse.

Moreover, the pulse generation circuit shown in FIG. 21 includes a feedback circuit, wherein an output signal is fed back and used for resetting or terminating the pulse (refer to Patent document 1).

[Patent Document 1]
Japanese Patent Application Laid-Open Publication No. 2000-188528
[Patent Document 2]
Japanese Patent Application Laid-Open Publication No. 11-136098

SUMMARY OF THE INVENTION

In the case of the pulse generation circuits in FIGS. 18, 19 and 21, a CLK load on a module is large, and a large number of transistors bring about an increase in size of a timing control unit, resulting in hindrance to a speedup.

Further, in the pulse generation circuit in FIG. 19, in the case of expanding the pulse width to a width larger than the input pulse signal width, if expanded approximately twice the input pulse signal width, this involves a criticality that the pulse might be deformed halfway.

Still further, in the case of employing the dynamic type pulse generation circuit in FIG. 20, there is a possibility that the output might get inconstant when turned on power-supply. Then, if the pulse generation circuit is constructed by use of SOI CMOS (Silicon On Insulator (especially PD) Complementary Metal Oxide Semiconductor) and when an operation cycle fluctuates in the circuit, there is a possibility that an internal timing deviates due to a history effect, and inconvenience occurs.

Yet further, the pulse generation circuits in FIGS. 18, 19 and 21 are incapable of generating the pulse having a larger pulse width than the input pulse signal.

Moreover, in the pulse generation circuit in FIG. 20, when in an initial status, the input line CLK is at the Lo-level, the output of the delay circuit 12 is at the Hi-level, a P-type MOS transistor Tr1 is OFF, and a second N-type MOS transistor Tr3 is OFF, so that the voltage level of the node n1 comes to an inconstant state, resulting in such a problem that a behavior gets unstable when turned on power.

Such being the case, it is an object of the present invention to provide a pulse generation circuit that is light in input load and capable of self-resetting.

To accomplish the above object, the present invention adopts the following means.

A pulse generation circuit according to the present invention comprises a P-type MOS transistor having a source electrode that is connected to a first power source line, a first N-type MOS transistor having a drain electrode that is connected to a drain electrode of the P-type MOS transistor, a second N-type MOS transistor having a drain electrode that is connected to the drain electrode of the first N-type MOS transistor, a gate electrode that is connected to an input line to which an input pulse signal is inputted, and a source electrode that is connected to a second power source line, a delay circuit having an input terminal that is connected to the drain electrode of the P-type MOS transistor and to the drain electrode of the first N-type MOS transistor, and an output terminal that is connected to the gate electrode of the P-type MOS transistor and to the gate electrode of the first N-type MOS transistor, an inverter having an input terminal that is connected to the drain electrode of the P-type MOS transistor and to the drain electrode of the second N-type MOS transistor, and an output terminal that is connected to an output line to which a generated pulse is outputted, and a keeper keeping a voltage level of the line to which the input terminal of the inverted is connected, wherein when the input pulse signal is inputted to the input line, an output pulse having a pulse width corresponding to a delay period of the delay circuit is generated.

Further, a pulse generation circuit according to the present invention comprises a P-type MOS transistor having a source electrode that is connected to a first power source line, a first N-type MOS transistor having a drain electrode that is connected to a drain electrode of the P-type MOS transistor, and a gate electrode that is connected to an input line to which an input pulse signal is inputted, a second N-type MOS transistor having a drain electrode that is connected to the drain electrode of the first N-type MOS transistor, and a source electrode that is connected to a second power source line, a delay circuit having an input terminal that is connected to the drain electrode of the P-type MOS transistor and to the drain electrode of the first N-type MOS transistor, and an output terminal that is connected to the gate electrode of the P-type MOS transistor and to the gate electrode of the second N-type MOS transistor, an inverter having an input terminal that is connected to the drain electrode of the P-type MOS transistor and to the drain electrode of the first N-type MOS transistor, and an output terminal that is connected to an output line to which a generated pulse is outputted, and a keeper keeping a voltage level of the line to which the input terminal of the inverted is connected, wherein when the input pulse signal is inputted to the input line, an output pulse having a pulse width corresponding to a delay of the delay circuit is generated.

In the pulse generation circuit, the delay circuit, of which the input terminal is connected via the inverter to the drain electrode of the P-type MOS transistor and to the drain electrode of the first N-type MOS transistor, may invert the pulse inputted from the input terminal and may output the inverted pulse to the gate electrode of the P-type MOS transistor and the gate electrode of the second N-type MOS transistor.

In the pulse generation circuit, the delay circuit may include at least one tap and may adjust the delay time on the basis of a control signal inputted via the tap.

In the pulse generation circuit, the delay circuit, when receiving a stop signal, may stop the output of the output pulse in a way that keeps high (Hi) voltage levels of the gate electrodes of the P-type MOS transistor and of the first N-type MOS transistor.

In the pulse generation circuit, a gate circuit may be provided between the output terminal of the delay circuit and the gate electrode of the first N-type MOS transistor, and the gate circuit may include a chopping delay circuit having an input terminal that is connected to the input line, and a NOR circuit having an input terminal that is connected respectively to an output terminal of the chopping delay circuit and to the output terminal of the delay circuit, and may input NOR of a pulse signal into which the output of the delay circuit in inverted and a pulse signal from the chopping delay circuit to the gate electrode of the second N-type MOS transistor.

In the pulse generation circuit, a gate circuit may be provided between the output terminal of the delay circuit and the gate electrode of the second N-type MOS transistor, and the gate circuit may include a chopping delay circuit having an input terminal that is connected to the input line, and a NOR circuit having an input terminal that is connected respectively to an output terminal of the chopping delay circuit and to the output terminal of the delay circuit, and may input NOR of a pulse signal into which the output of the delay circuit in inverted and a pulse signal from the chopping delay circuit to the gate electrode of the first N-type MOS transistor.

BRIEF DESCRIPTION OF THE DRAWINGS

FIG. 5A-5C are diagram showing comparisons in performance between the present invention and the prior arts;

DETAILED DESCRIPTION OF THE PREFERRED EMBODIMENT

A pulse generation circuit defined as an embodiment of the present invention will hereinafter be described with reference to the drawings in FIGS. 1 through 17.

Figure 1:
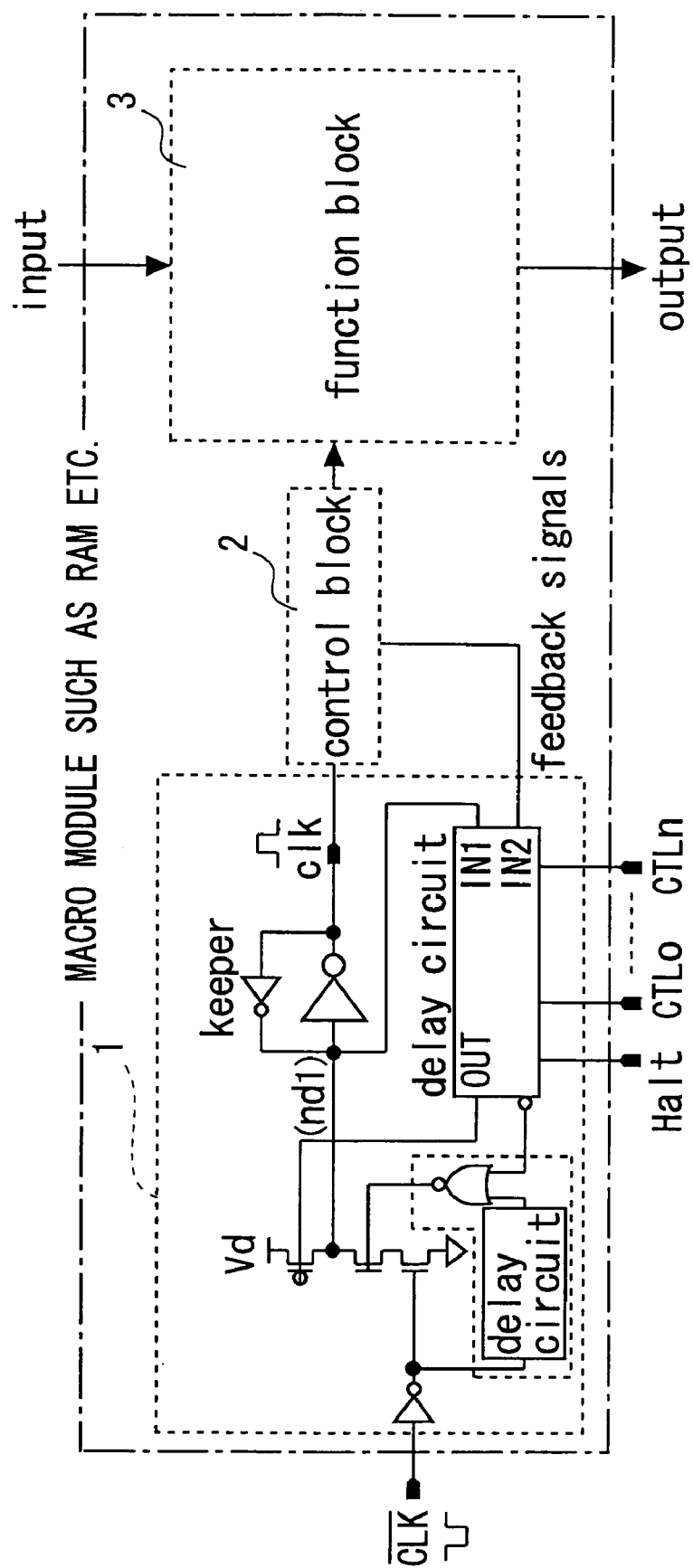
FIG. 1 is a diagram showing blocks of functions within an LSI as one embodiment of the present invention.

FIG. 1 is a diagram showing blocks of functions within an LSI (Large Scale Integration) defined one embodiment of the present invention. As shown in FIG. 1, the LSI is provided with a pulse generation circuit 1 of the present invention, a control block 2 and a function block 3.

This pulse generation circuit 1 generates an output pulse clk having a predetermined pulse width on the basis of an input pulse signal CLK. The control block 2 inputs a feedback signal to a delay circuit of the pulse generation circuit 1 in accordance with the output pulse clk, thereby controlling the pulse width. The function block 3 is a circuit block that operates by use of the pulse clk generated in this pulse generation circuit 1.

First Embodiment

Figure 2:
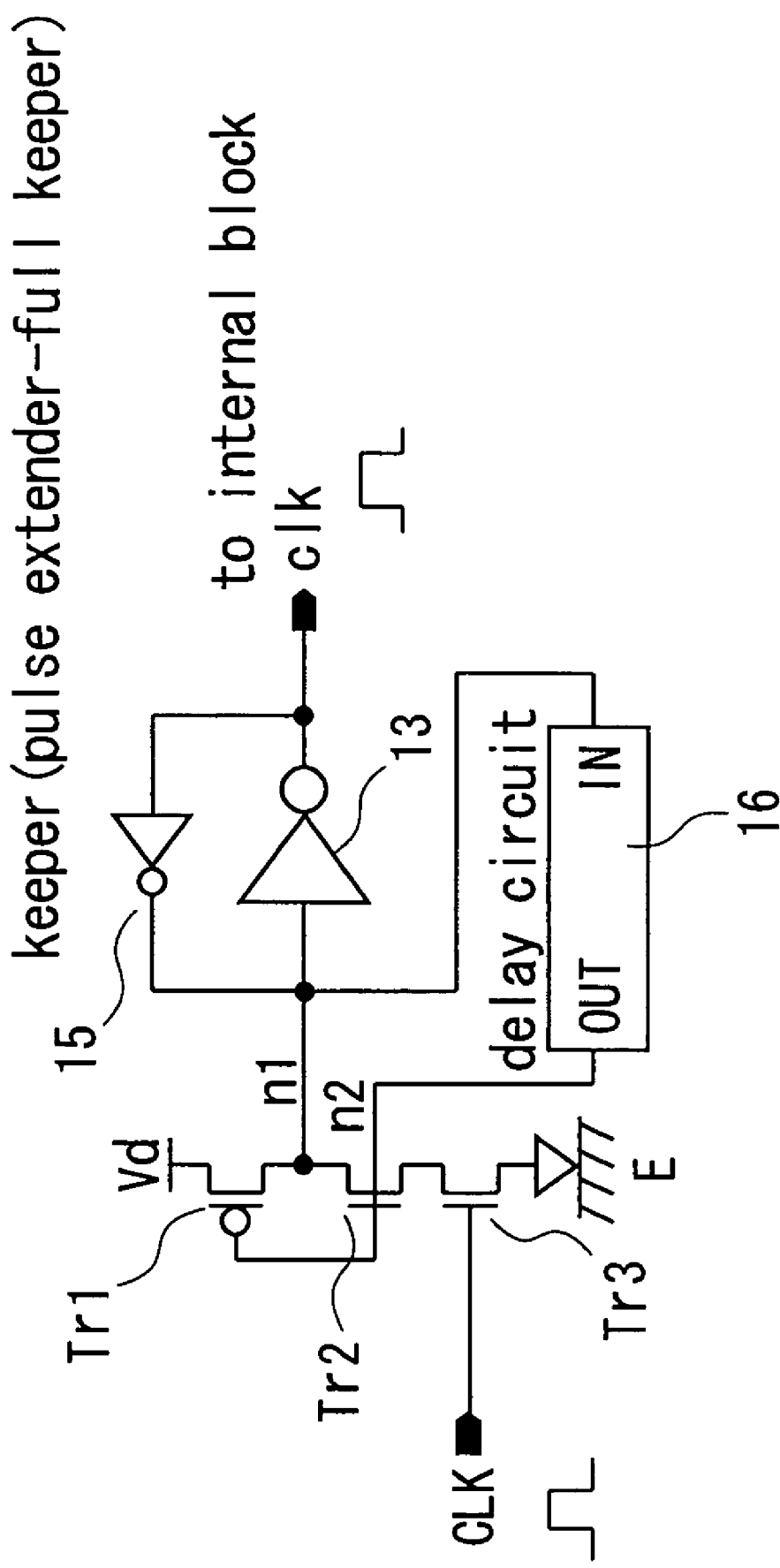
FIG. 2 is an explanatory diagram of a pulse generation circuit as a first embodiment of the present invention.

FIG. 2 shows the pulse generation circuit as a first embodiment of the present invention.

The pulse generation circuit 1 in the first embodiment is constructed of a P-type MOS (Metal Oxide Semiconductor) transistor Tr1, first and second N-type MOS transistors Tr2, Tr3, a delay circuit 16, an inverter 13 and a keeper 15.

A source electrode of the P-type MOS transistor Tr1 is connected to a first power source line. A drain electrode of the first N-type MOS transistor Tr2 is connected to a drain electrode of the P-type MOS transistor Tr1.

A drain electrode of the second N-type MOS transistor Tr3 is connected to the drain electrode of the first N-type MOS transistor Tr2, a gate electrode of the second N-type MOS transistor Tr3 is connected to an input line CLK to which the input pulse signal is inputted, and a source electrode thereof is connected to a second power source line. In this first embodiment, the first power source line is-a power source line supplied with a predetermined (+) side voltage, and the second power source line E is a ground line.

The delay circuit 16 is constructed by connecting an even number of inverters in series, wherein input terminals are connected to the drain electrode of the P-type MOS transistor Tr1 and to the drain electrode of the first N-type MOS transistor Tr2, and output terminals are connected to the gate electrode of the P-type MOS transistor Tr1 and to the gate electrode of the first N-type MOS transistor Tr2.

The inverter 13, of which the input terminal is connected to the drain electrode of the P-type MOS transistor Tn and to the drain electrode of the second N-type MOS transistor Tr3, inverts the inputted pulse and outputs the inverted pulse to the output line clk.

The keeper 15 keeps a state of voltage of the line (node n1) to which the input terminal of the inverter 13 is connected, and, in the first embodiment, has the same construction as the construction of the inverters that inverts a voltage level of the output line clk and keeps the voltage level of the node n1. In the first embodiment, when electrified (electrical conduction) between the drain and the source of the P-type MOS transistor Tr1, a voltage from a first power source line Vd is applied so that the node n1 becomes a Hi-level, and, when the P-type MOS transistor Tr1 opens (OFF) while the first and second N-type MOS transistor Tr2, Tr3 close (ON), the voltage of the node n1 is grounded, resulting in a Lo-level. As a concomitant of this, the keeper 15 keeps the node n1 at Lo when the output line clk as the output of the inverter 13 becomes the Hi-level and keeps the node n1 at the Hi-level when the output line clk comes to Lo.

Figure 3:
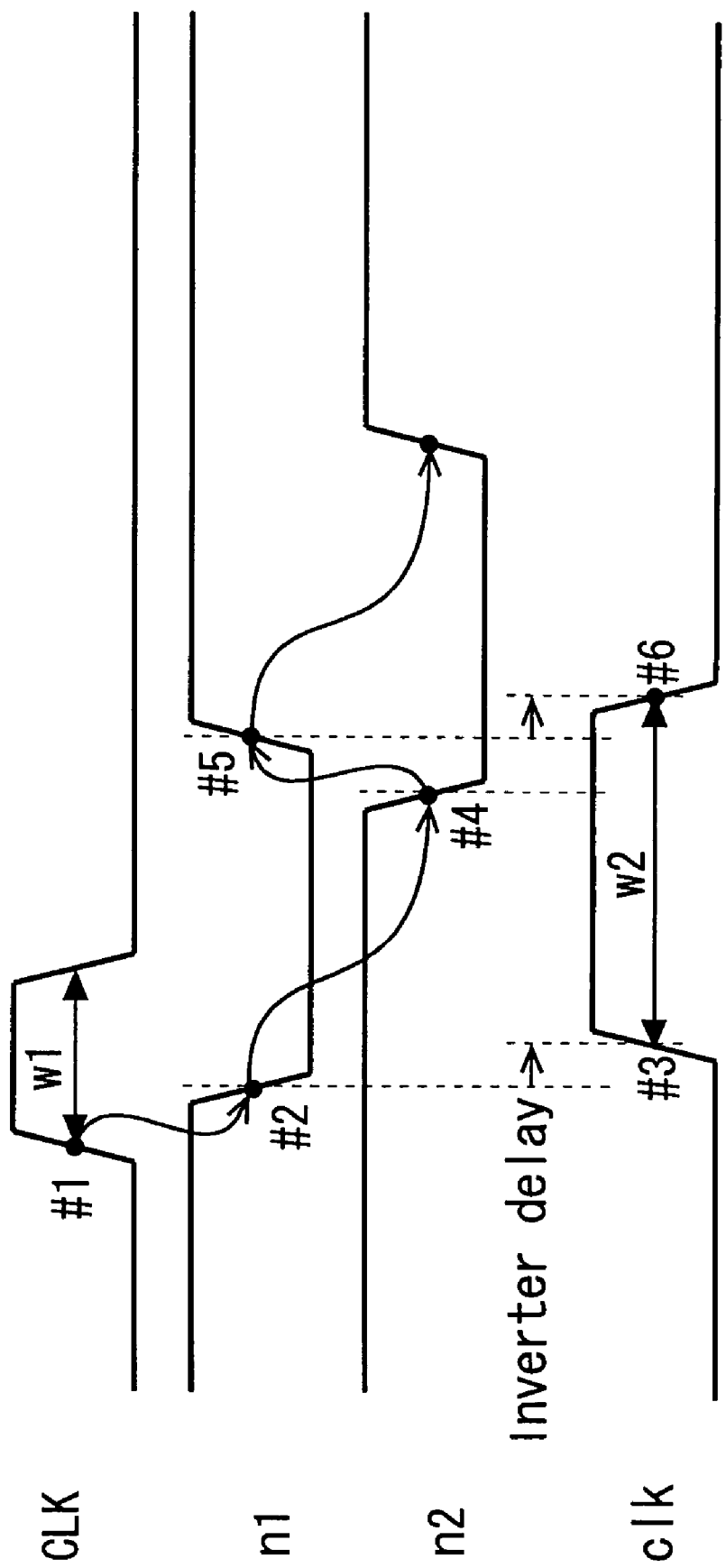
FIG. 3 is an explanatory diagram of an operation of the pulse generation circuit.

FIG. 3 is an explanatory diagram of the operation of the pulse generation circuit 1 in the first embodiment.

To begin with, the pulse generation circuit 1 in the first embodiment performs self-resetting as will be explained later on, whereby the P-type MOS transistor Tr1 is switched OFF, the first N-type MOS transistor Tr2 is switched ON, the second N-type MOS transistor Tr3 is switched OFF, and the node n1 becomes the Hi-level.

In this initial status, when the pulse signal having a pulse width W1 is inputted to the gate electrode of the second N-type MOS transistor Tr3 from the input line CLK (#1), the second N-type MOS transistor Tr3 is switched ON, and, because of the first N-type MOS transistor Tr2 being ON, the node n1 becomes the Lo-level (#2). At this time, as a node n2 on the output side of the delay circuit 16 is kept at the Hi-level, the P-type MOS transistor Tr1 and the first N-type MOS transistor Tr2 remain in the initial status, and the node n1 is kept at the Lo-level by the keeper 15. Hence, this voltage level is inverted by the inverter 13, and the output line clk becomes the Hi-level from #2 with an inverter delay (#3).

Then, a fall of #2 appears in the node n2 with a time-lag corresponding to a delay period of the delay circuit 16 (#4). As this node n2 becomes the Lo-level, the P-type MOS transistor Tr1 is switched ON, the first N-type MOS transistor Tr2 is switched OFF, and the node n1 again becomes the Hi-level (#5), whereby the output line clk comes to the Lo-level and a pulse width w2 corresponding to the delay period of the delay circuit 16 is generated.

Thus, the pulse generation circuit 1 in the first embodiment is a dynamic type pulse generation circuit, wherein the keeper keeps the voltage level from the fall of the node n1 when the input pulse signal is inputted down to the rise of the node n1 after this input pulse signal has been outputted from the delay circuit 16, and the pulse corresponding to this delay is generated. It is therefore possible to generate the pulse with the predetermined width by arbitrarily setting the delay period of the delay circuit 16 without depending on the pulse width of the input pulse signal.

Figure 4:
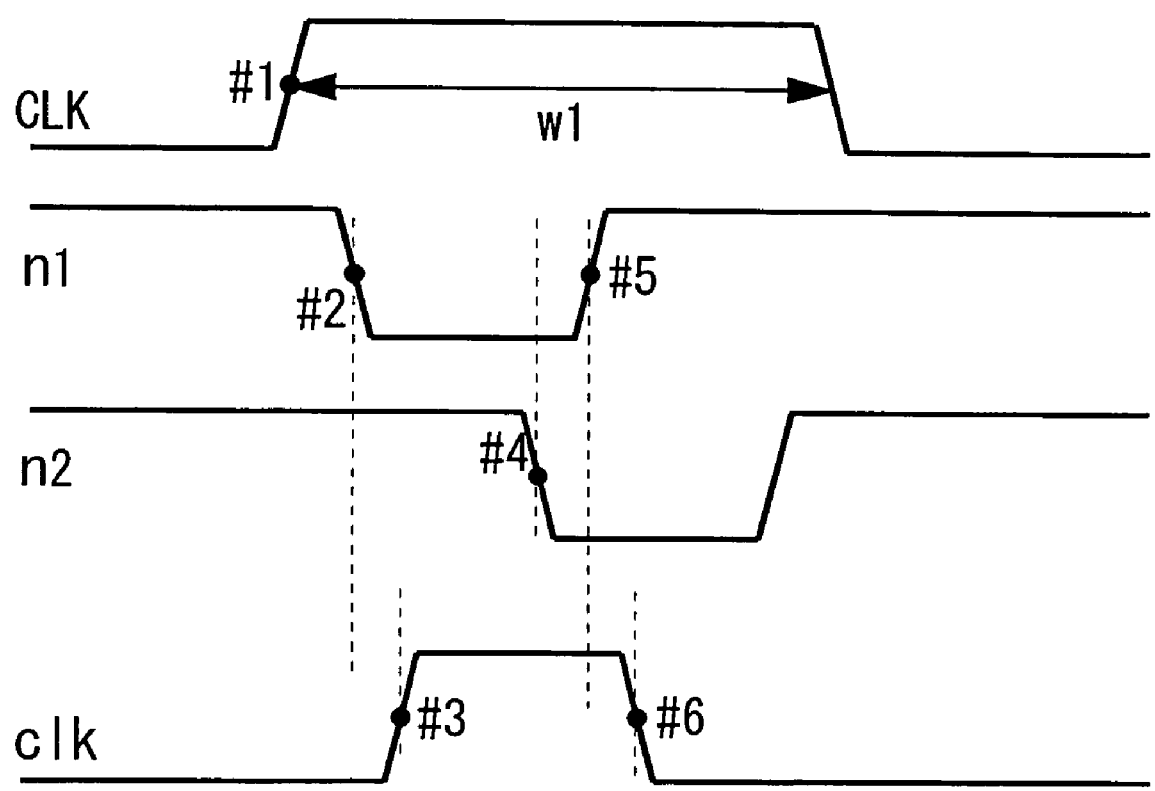
FIG. 4 is an explanatory diagram of the operation of the pulse generation circuit.

Accordingly, as shown in FIG. 4, the pulse with the shorter pulse width than the input pulse signal has, can be generated by setting short the delay period of the delay circuit 16.

Further, in the pulse generation circuit 1 in the first embodiment, the element connected to the input line CLK is only the second N-type MOS transistor Tr3, and an input load is reduced as compared with the prior art. Hence, it is feasible to gain a speedup and to save the electric power.

Moreover, if of the dynamic type, a behavior in the initial status might get uncertain, however, the pulse generation circuit 1 in the first embodiment is capable of establishing (self-resetting) the voltage level of the node n1 by, when effecting power-on, feeding the output-sided voltage level back to the gate electrodes of the P-type MOS transistor Tr1 and of the first N-type MOS transistor Tr2 by the delay circuit 16.

To be specific, the pulse generation circuit 1 in the first embodiment operates such that when the input line CLK is at the Lo-level and the power is OFF, the P-type MOS transistor Tr1 is ON, the first N-type MOS transistor Tr2 is OFF, and the second N-type MOS transistor Tr3 is OFF; and, when turned on the power, a voltage is applied to the P-type MOS transistor Tr1 from the power source V, so that the node n1 becomes the Hi-level. Then, when the node n1 comes to the Hi-level, the voltage levels at the gate electrodes of the P-type MOS transistor Tr1 and of the first N-type MOS transistor Tr2 become the Hi-level through the delay circuit 16, whereby the P-type MOS transistor Tr1 is OFF, the first N-type MOS transistor Tr2 is ON, the second N-type MOS transistor Tr3 is OFF, and the node n1 is fixed to the Hi-level.

Figure 18:
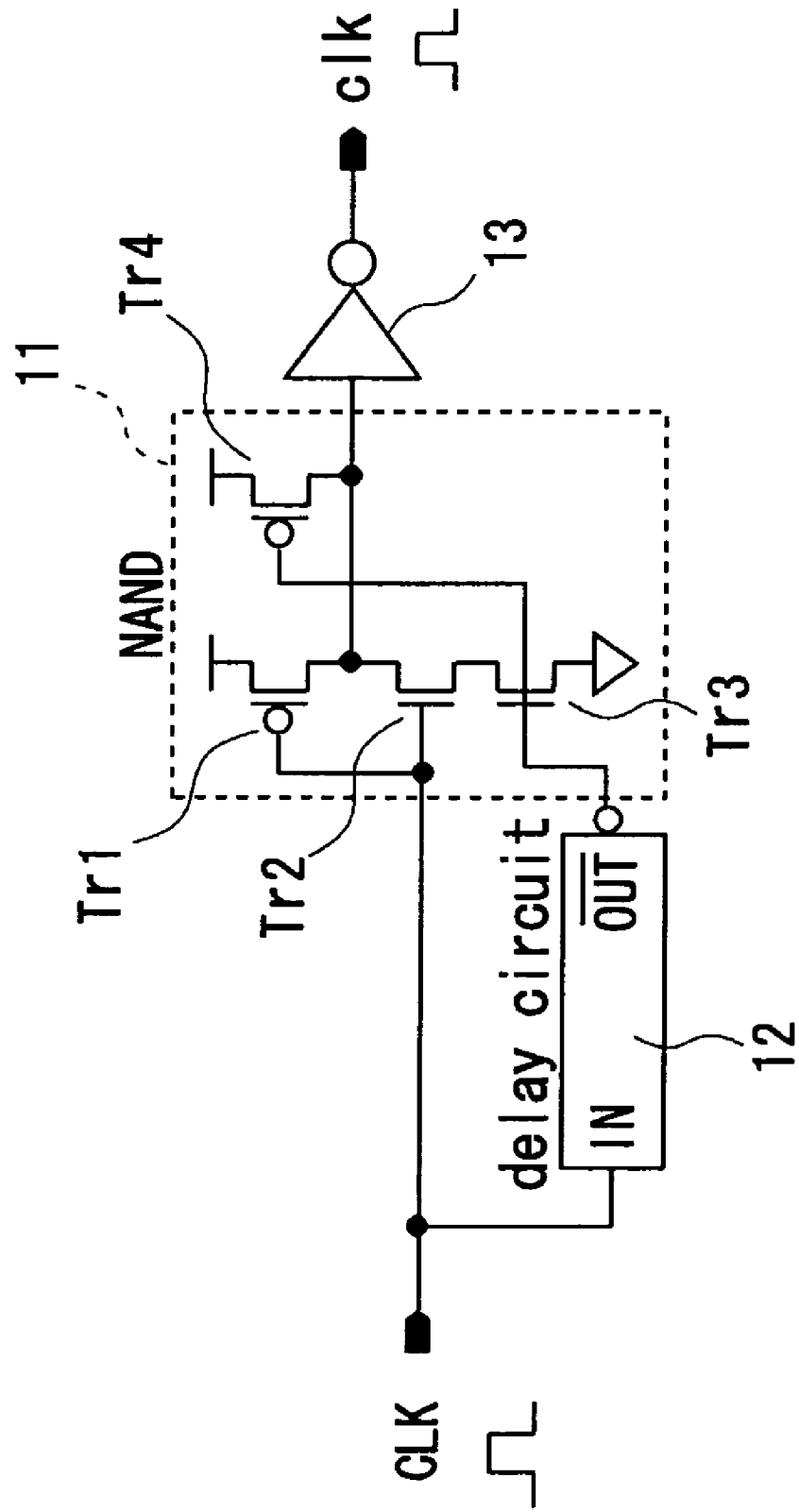
FIG. 18 is an explanatory diagram of a conventional pulse generation circuit.
Figure 19:
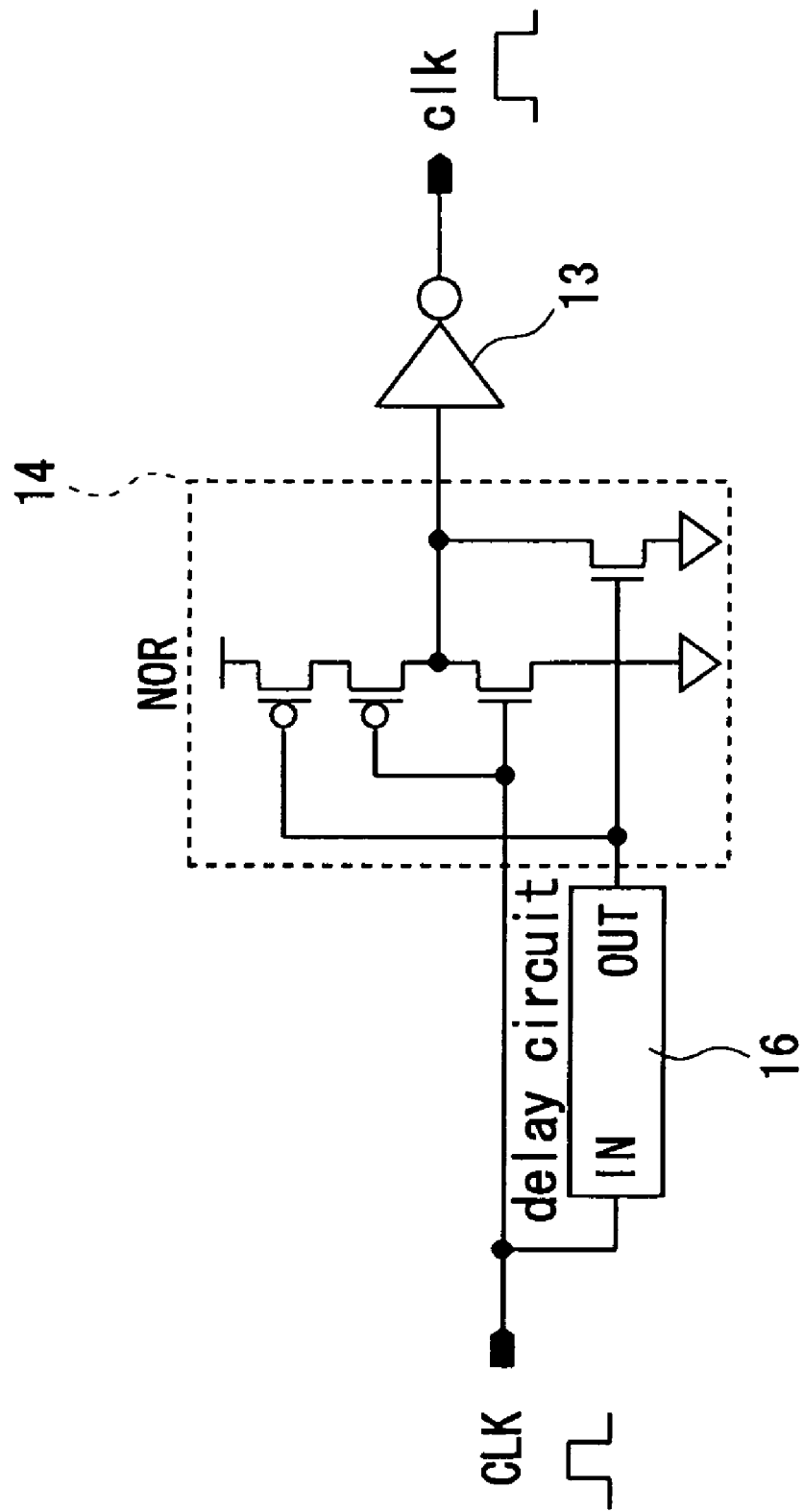
FIG. 19 is an explanatory diagram of a conventional pulse generation circuit.
Figure 20:
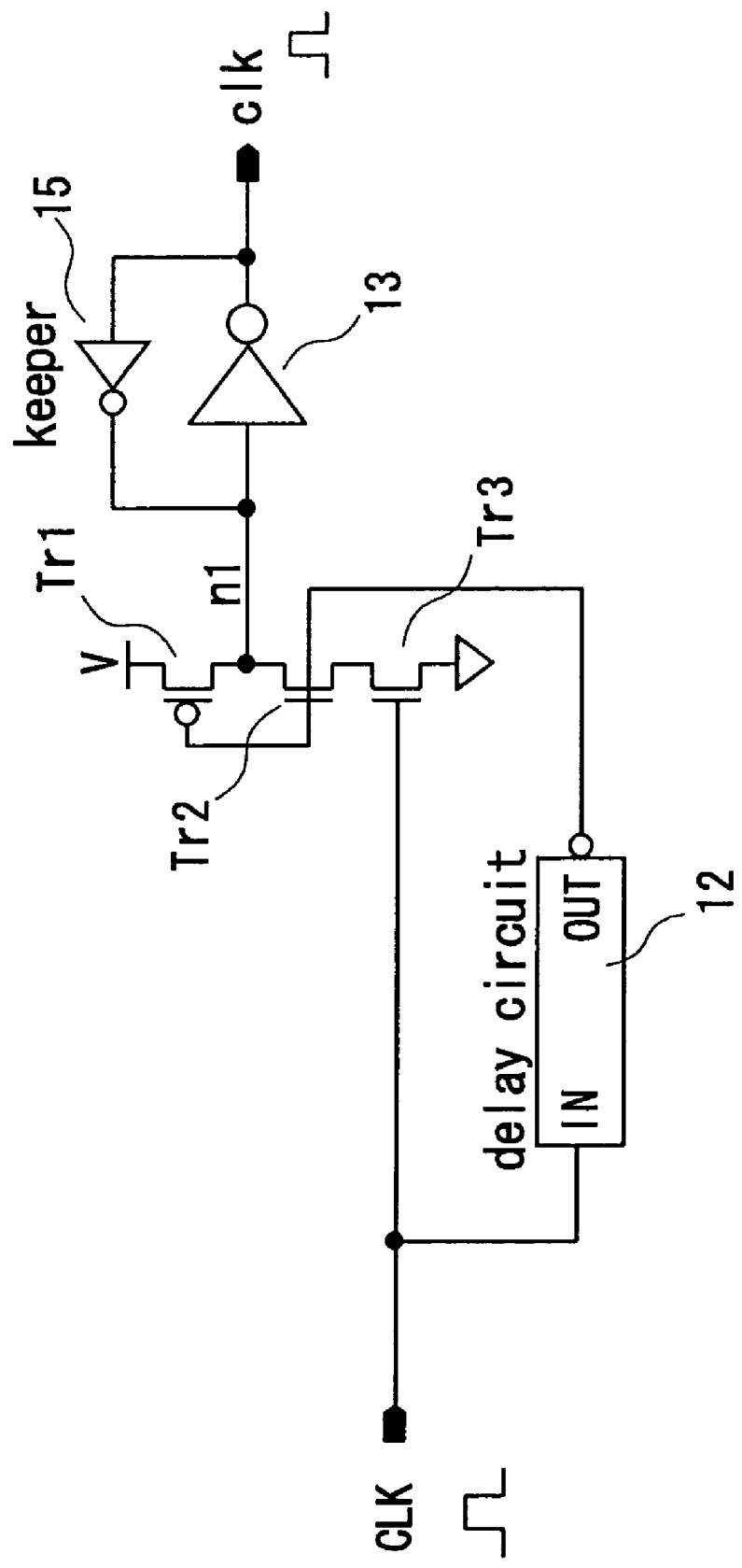
FIG. 20 is an explanatory diagram of a conventional pulse generation circuit.
Figure 21:
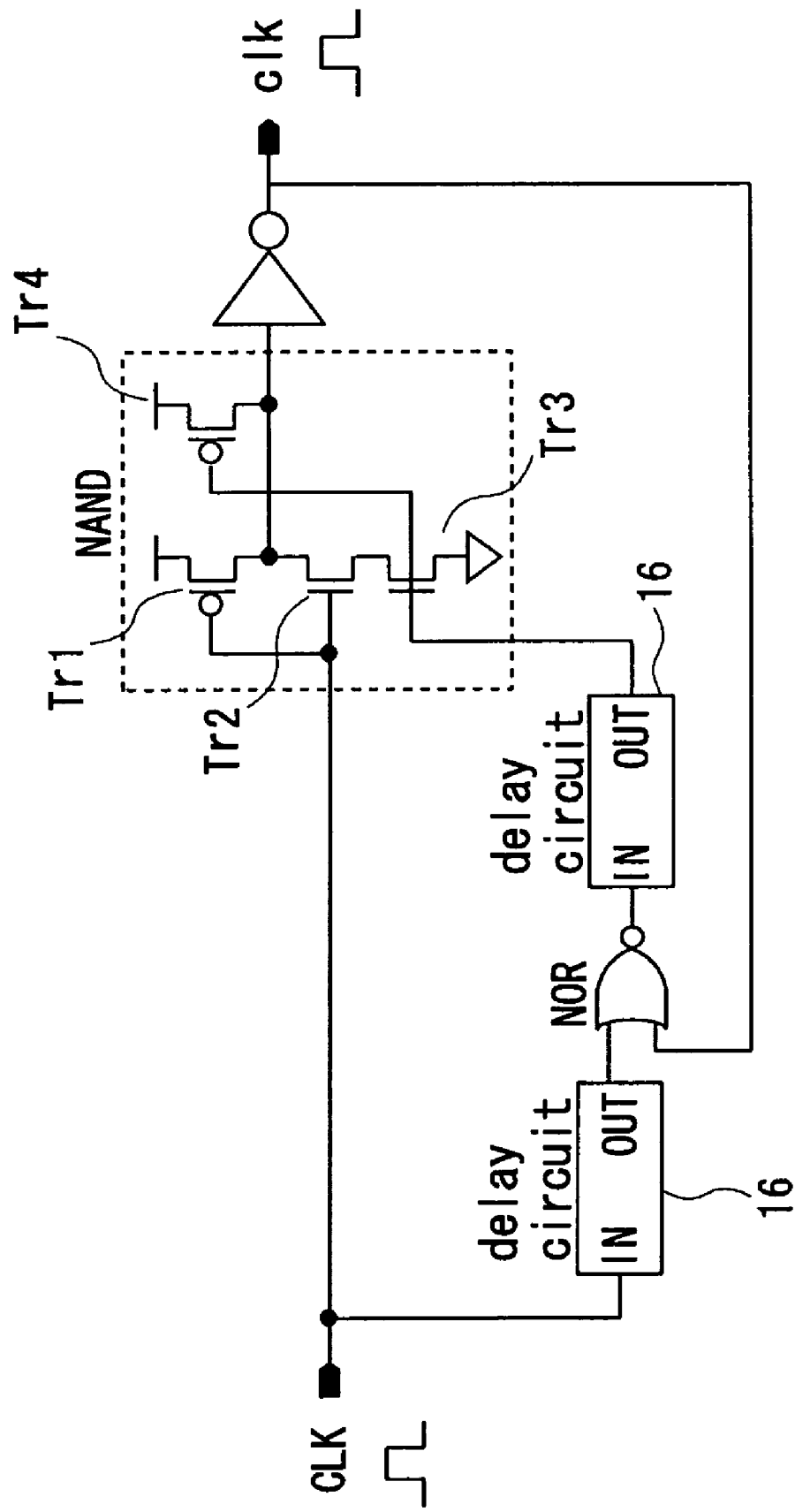
FIG. 21 is an explanatory diagram of a conventional pulse generation circuit.

FIG. 5 is a graphic chart showing comparisons in performance between the pulse generation circuit in the first embodiment and the conventional pulse generation circuits shown in FIGS. 18 and 21.

Figure 5B:
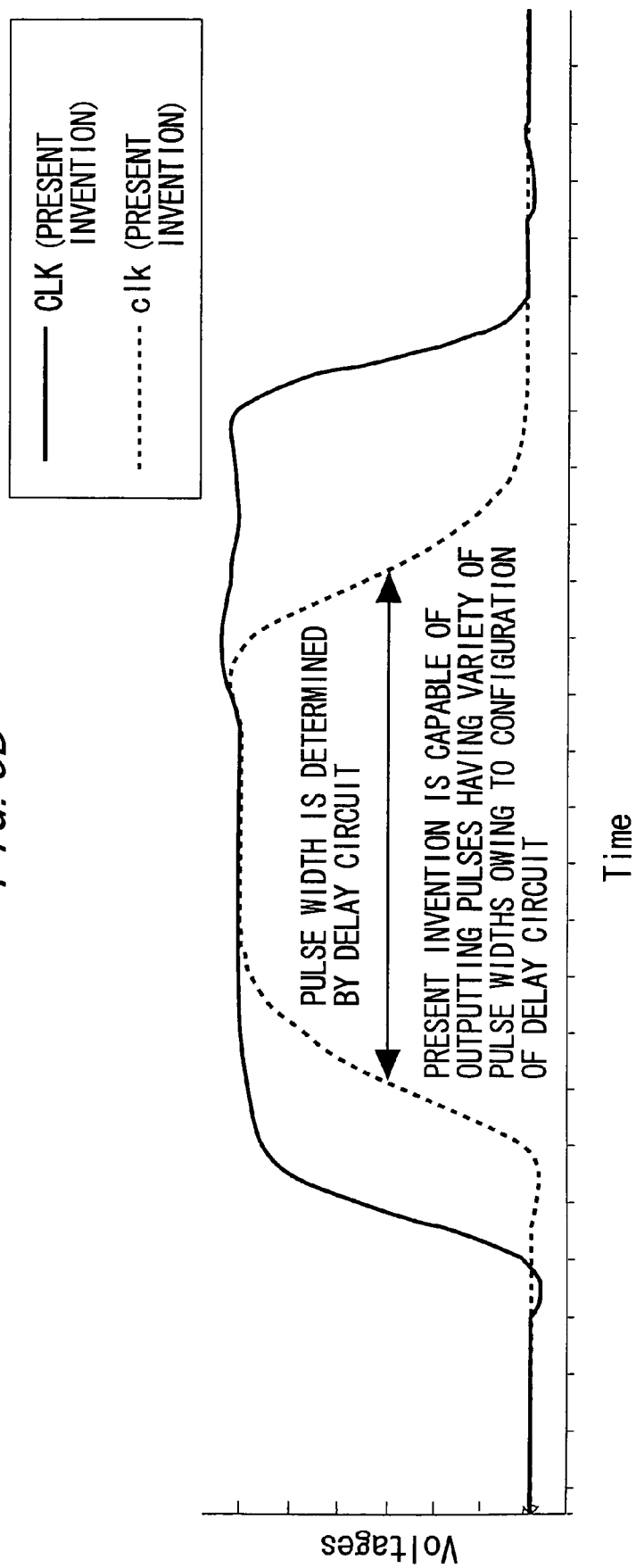
Figure 5C:
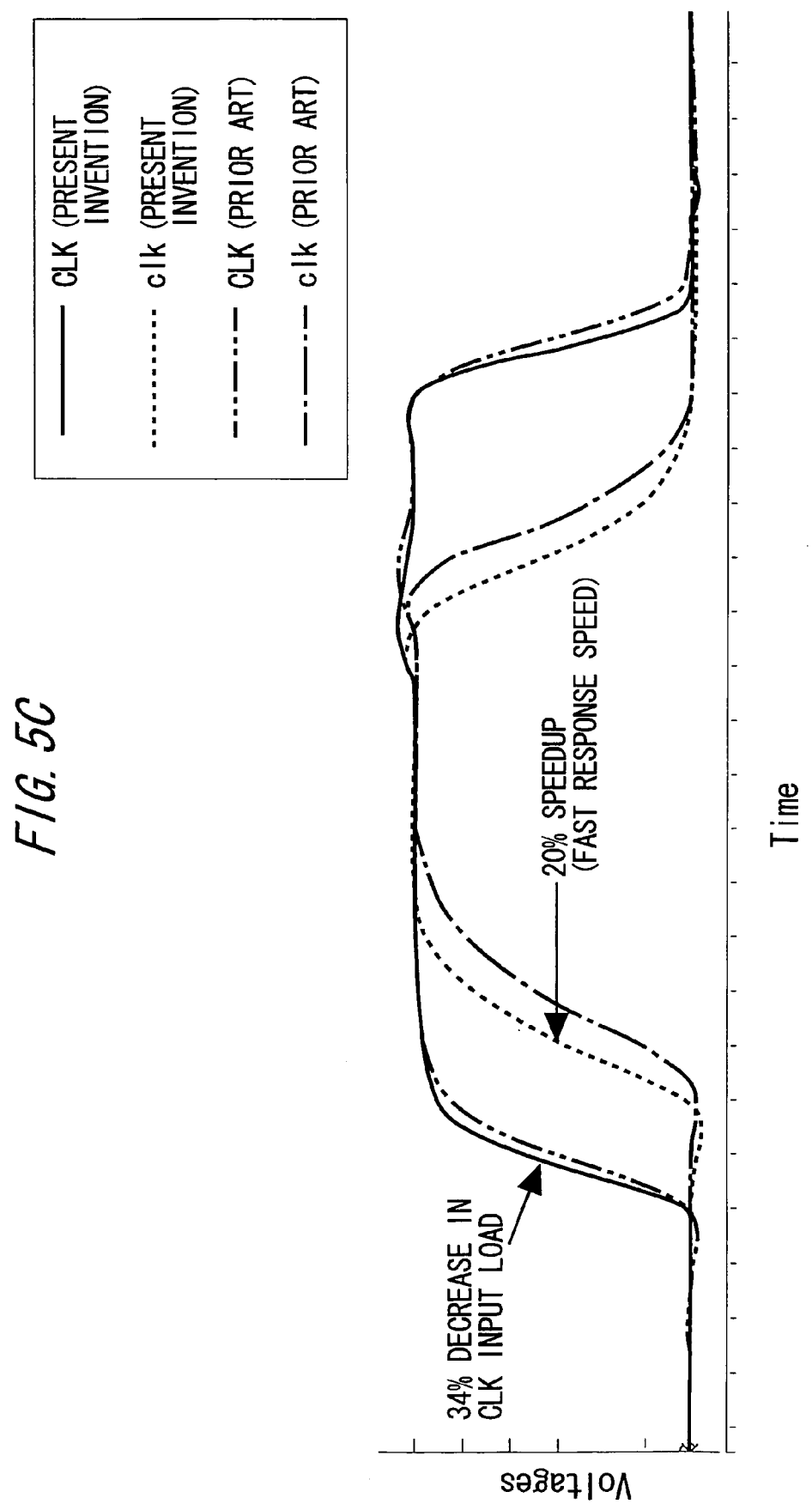

FIG. 5(a) shows an input pulse signal and an output pulse signal in the conventional pulse generation circuit. FIG. 5(b) shows an input pulse signal and an output pulse signal in the pulse generation circuit in the first embodiment. FIG. 5(c) shows comparisons between waveforms shown in FIGS. 5(a) and 5(b).

As shown in FIG. 5(c), the pulse generation circuit 1 in the first embodiment gains a 34% reduction in its input load, an early rise in pulse and a 20% speedup in respondency of the output pulse.

Second Embodiment

Figure 6:
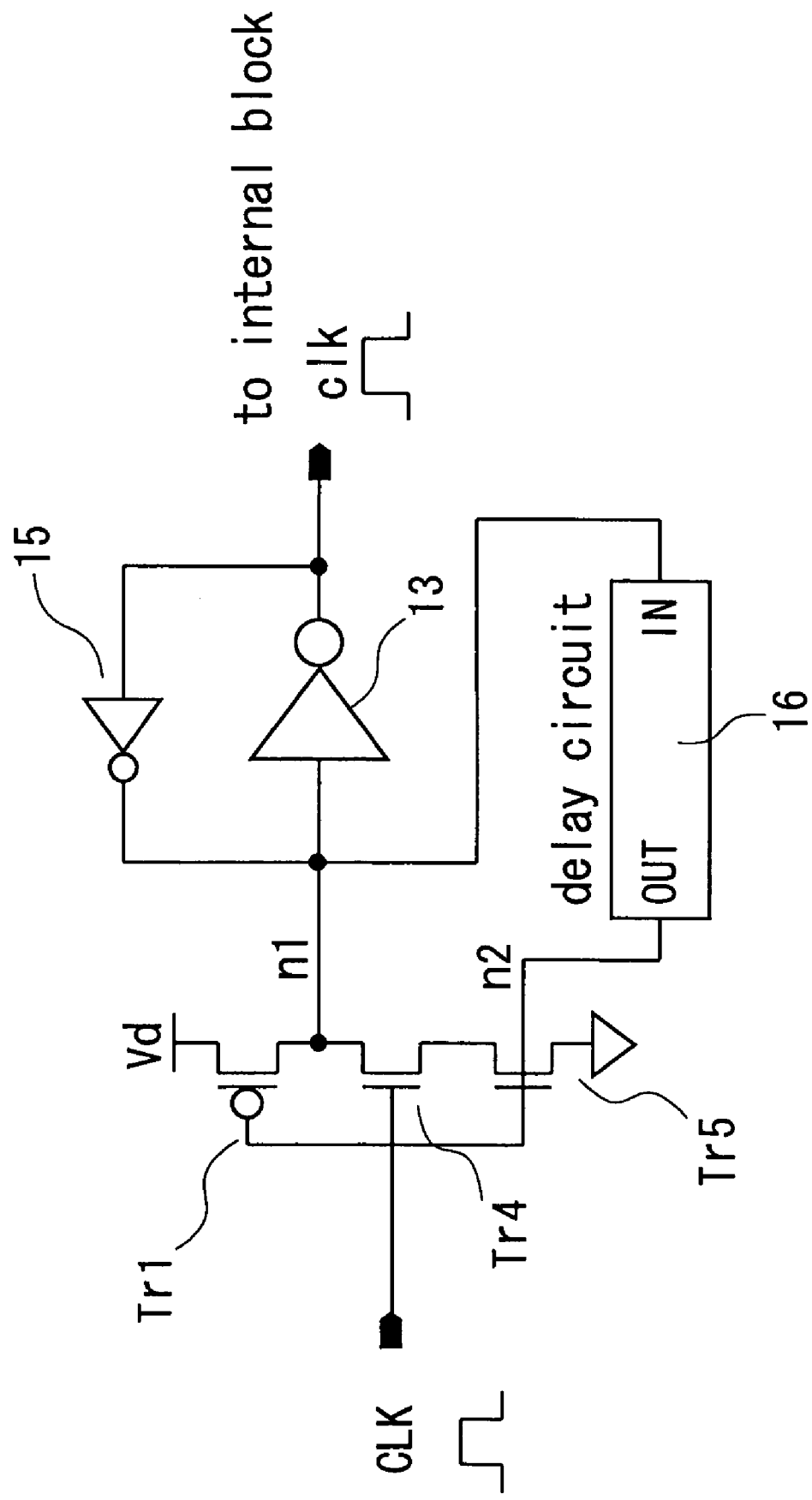
FIG. 6 is an explanatory diagram of the pulse generation circuit as a second embodiment of the present invention.

The first embodiment takes the configuration that the input pulse signal is inputted to the second N-type MOS transistor Tr3, and the output of the delay circuit 16 is inputted to the P-type MOS transistor Tr1 and to the first N-type MOS transistor Tr2 (corresponding to claim 1), however, another configuration shown in FIG. 6 is also available, wherein the layout of the N-type MOS transistors is exchanged (corresponding to claim 2).

Specifically, in the pulse generation circuit 1 in the second embodiment, the source electrode of the P-type MOS transistor Tr1 is connected to the first power source line, a drain electrode of a first N-type MOS transistor Tr4 is connected to the drain electrode of the P-type MOS transistor Tr1, and a gate electrode of the first N-type MOS transistor Tr4 is connected to the input line to which the input pulse signal is inputted. Further, a drain electrode of a second N-type MOS transistor Tr5 is connected to the drain electrode of the first N-type MOS transistor Tr4, and a source electrode of the second N-type MOS transistor Tr5 is connected to the second power source line (ground line).

Then, the input terminal of the delay circuit 16 is connected to the drain electrode of the P-type MOS transistor Tr1 and to the drain electrode of the first N-type MOS transistor Tr4, and the output terminal of the delay circuit 16 is connected to the gate electrode of the P-type MOS transistor Tr1 and to the gate electrode of the second N-type MOS transistor Tr5.

The input terminal of the inverter 13 is connected to the drain electrode of the P-type MOS transistor Tr1 and to the drain electrode of the first N-type MOS transistor Tr4, and the output terminal of the inverter 13 is connected to the output line clk. Further, the keeper 15 keeps the voltage level of the node n1 to which the input terminal of the inverter 13 is connected.

Thus, also in the configuration of the second embodiment, the waveforms appearing in the nodes n1, n2 in the case of inputting the input pulse signal to the input line CLK are the same as those in FIGS. 3 and 4 given above, and the same effect as in the first embodiment discussed above is acquired.

It should be noted that, in the following embodiment, the layout of the first and second N-type MOS transistors Tr2, Tr3 maybe changed to the layout of the first and second N-type MOS transistors Tr4, Tr5 as in the second embodiment.

Third Embodiment

Figure 7:
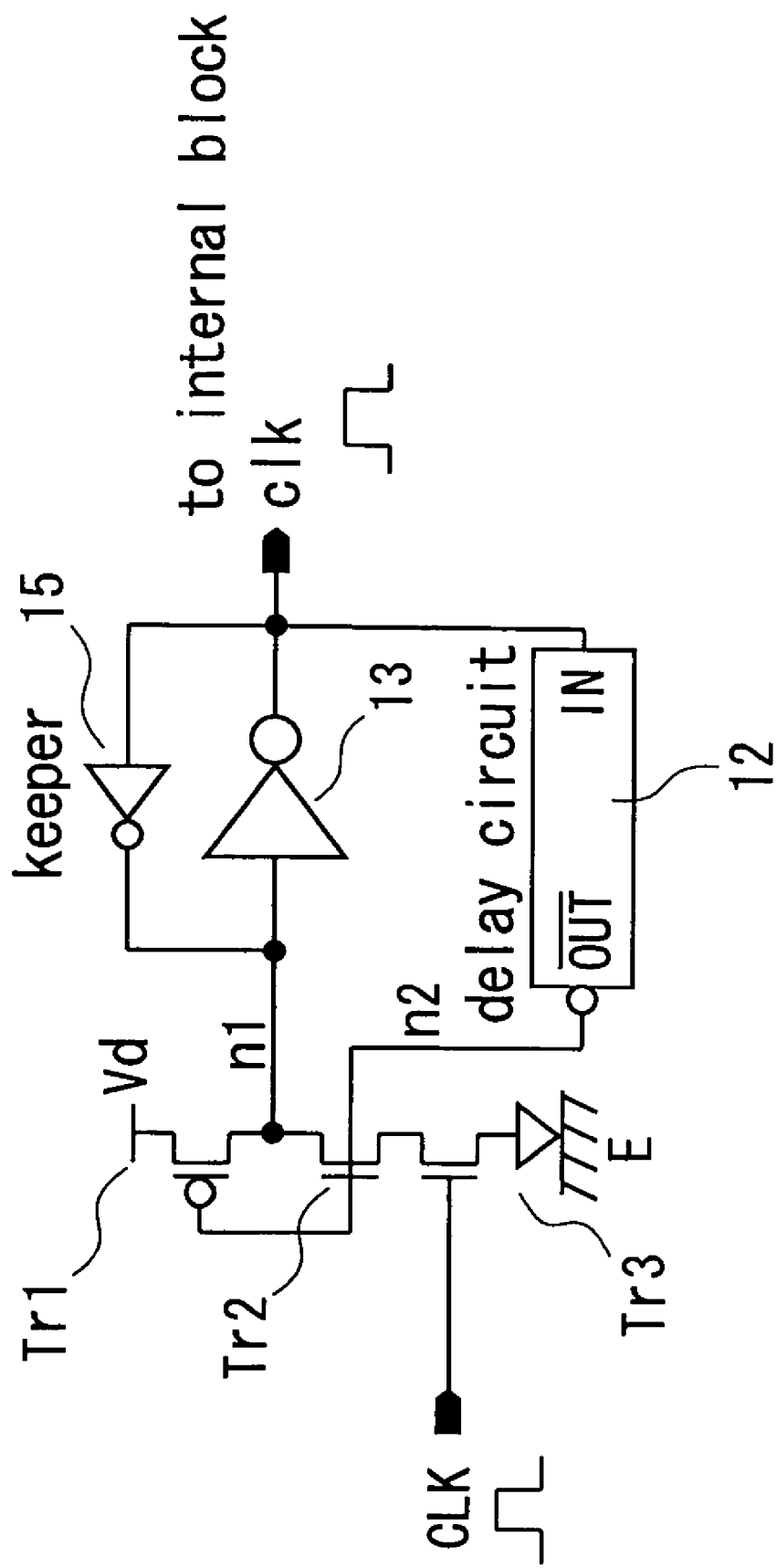
FIG. 7 is an explanatory diagram of the pulse generation circuit as a third embodiment of the present invention.

In the first embodiment discussed above, the input terminal of the delay circuit is connected to the drain electrode of the P-type MOS transistor Tr1 and to the drain electrode of the first N-type MOS transistor Tr2, i.e., to the node n1, however, the present invention is not limited to this connection. For example, in a third embodiment, as shown in FIG. 7, an input terminal of a delay circuit 12 is connected to the output line clk. This delay circuit 12 takes a configuration that an odd number of inverters are connected in series. Other configurations are the same as those in the first embodiment discussed above, and hence the repetitive explanations are omitted in a way that marks the same components with the same numerals and symbols.

Namely, in the pulse generation circuit 1 in the third embodiment, the voltage level of the node n1 is inverted by the inverter 13 and is thus inputted to the delay circuit 12, and consequently this voltage level is, after being inverted, outputted to the node n2.

Thus, also in the configuration of the third embodiment, the waveforms appearing in the nodes n1, n2 in the case of inputting the input pulse signal to the input line CLK are the same as those in FIGS. 3 and 4 given above, and the same effect as in the first embodiment discussed above is acquired.

Fourth Embodiment

In the first embodiment discussed above, the keeper 15 functions as a Full keeper for keeping the voltage level of the node n1 at the Hi- or Lo-level, however, in the case of the pulse generation circuit (which is a so-called chopper) that generates a shorter pulse than the input pulse signal, the node n1 may be kept at the Hi-level, so that a High keeper for keeping the node n1 in the Hi-state may also be available.

Figure 8:
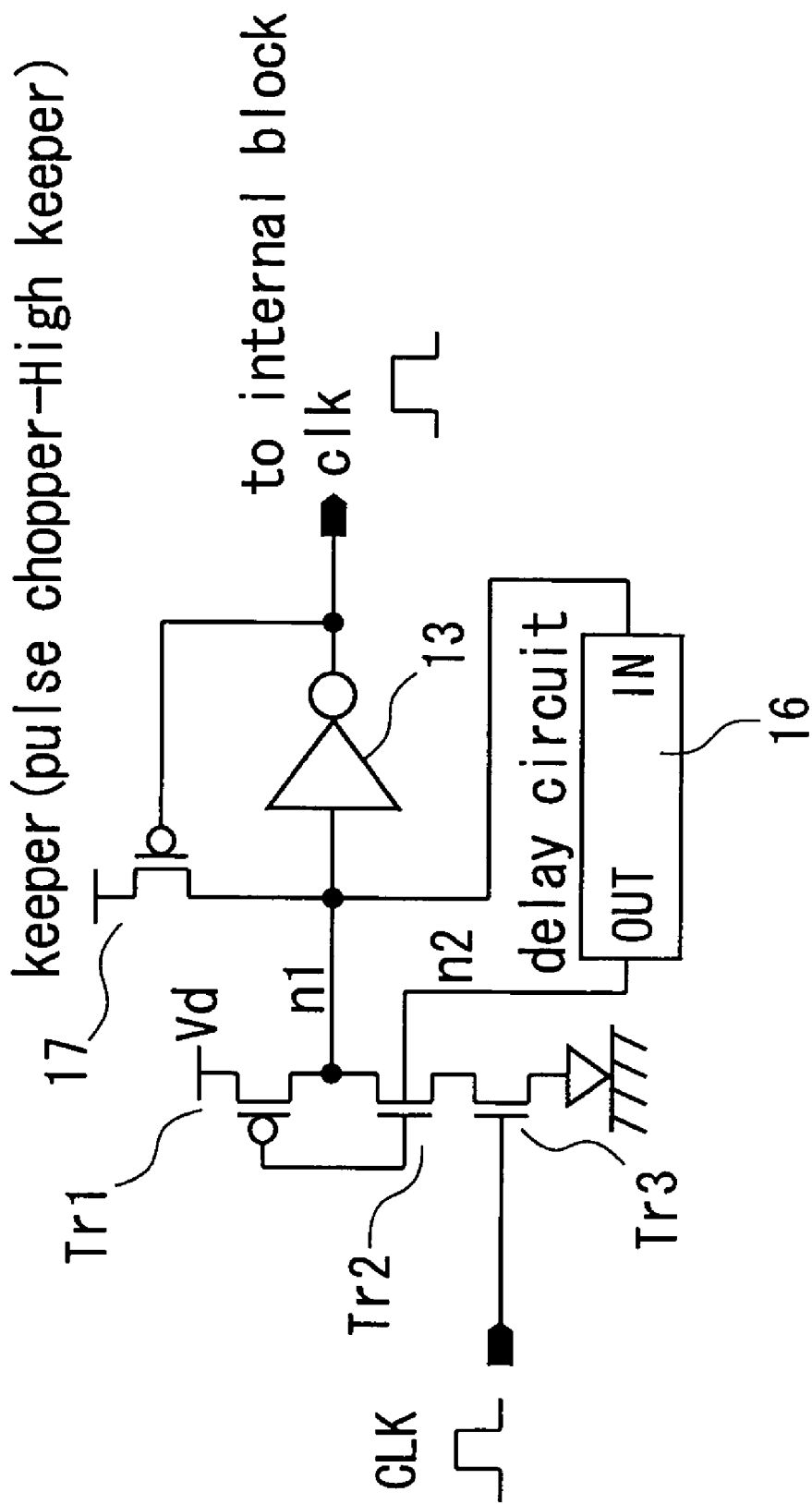
FIG. 8 is an explanatory diagram of the pulse generation circuit as a fourth embodiment of the present invention.

In a fourth embodiment, as shown in FIG. 8, a High keeper 17 is constructed of a P-type MOS transistor of which a gate electrode is connected to the output line clk. With this configuration, when the output line clk becomes the Lo-level, the voltage level of the node n1 is kept at the Hi-level by applying the voltage from the power source.

Also in the configuration of the fourth embodiment, the waveforms appearing in the nodes n1, n2 in the case of inputting the input pulse signal to the input line CLK are the same as those in FIG. 4 given above, and the same effect as in the first embodiment discussed above is acquired.

Fifth Embodiment

A fifth embodiment takes a configuration that the High keeper 17 is provided as a substitute for the keeper 15 of the pulse generation circuit 1 in the third embodiment (FIG. 7) discussed above, and other configurations are the same as those in the third embodiment.

Figure 9:
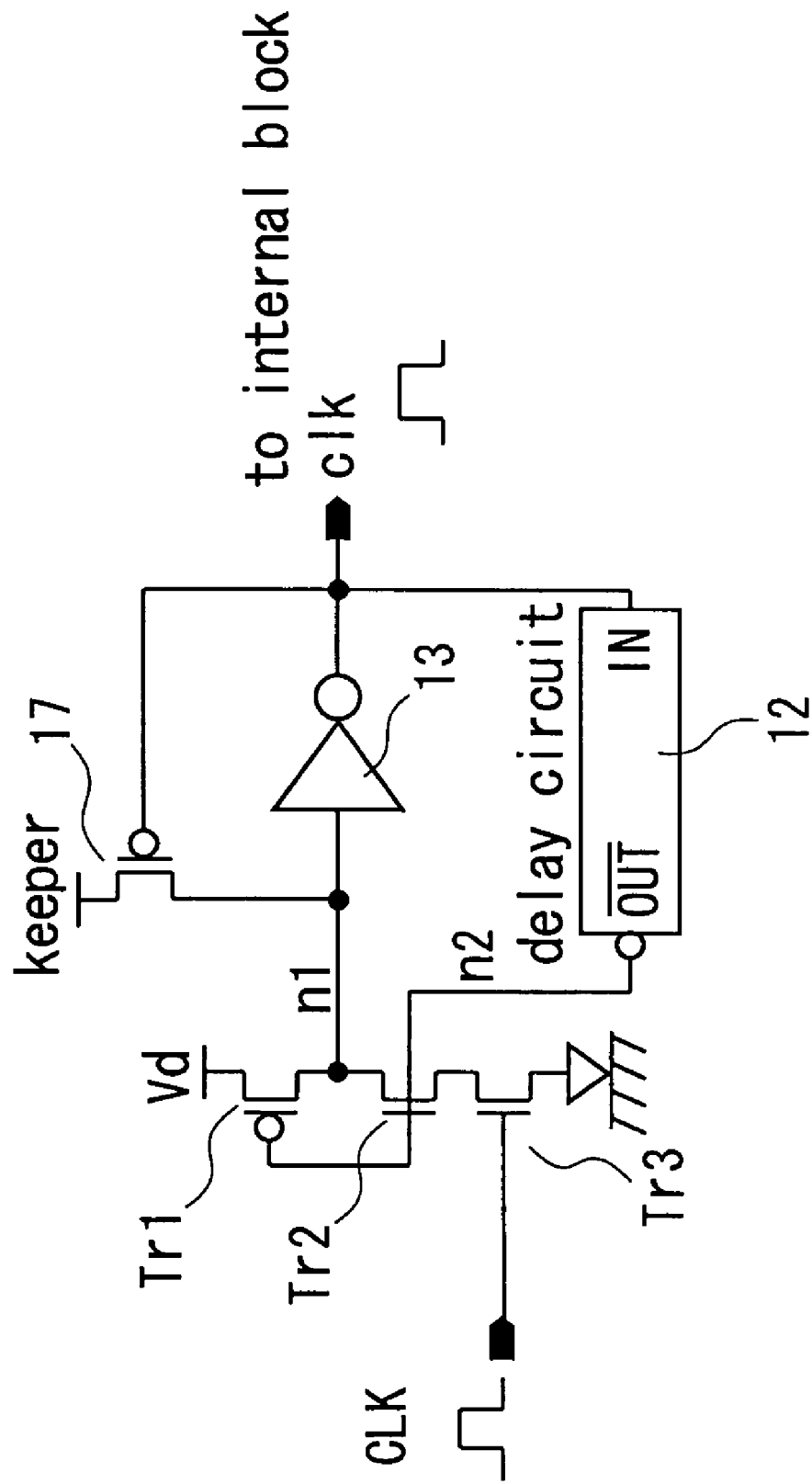
FIG. 9 is an explanatory diagram of the pulse generation circuit as a fifth embodiment of the present invention.

FIG. 9 is an explanatory diagram of the fifth embodiment. As shown in FIG. 9, the pulse generation circuit 1 in the fifth embodiment is such that the High keeper 17 is constructed of the P-type MOS transistor of which the gate electrode is connected to the output line clk.

Also in the configuration of the fifth embodiment, the waveforms appearing in the nodes n1, n2 in the case of inputting the input pulse signal to the input line CLK are the same as those in FIG. 4 given above, and the same effect as in the third embodiment discussed above is acquired.

Sixth Embodiment

A sixth embodiment is different from the first embodiment discussed above in terms of providing taps in the delay circuit, and other configurations are the same as those in the first embodiment. Therefore, the repetitive explanations are omitted in a way that marks the same components as those in the first embodiment discussed above with the same numerals and symbols.

Figure 10:
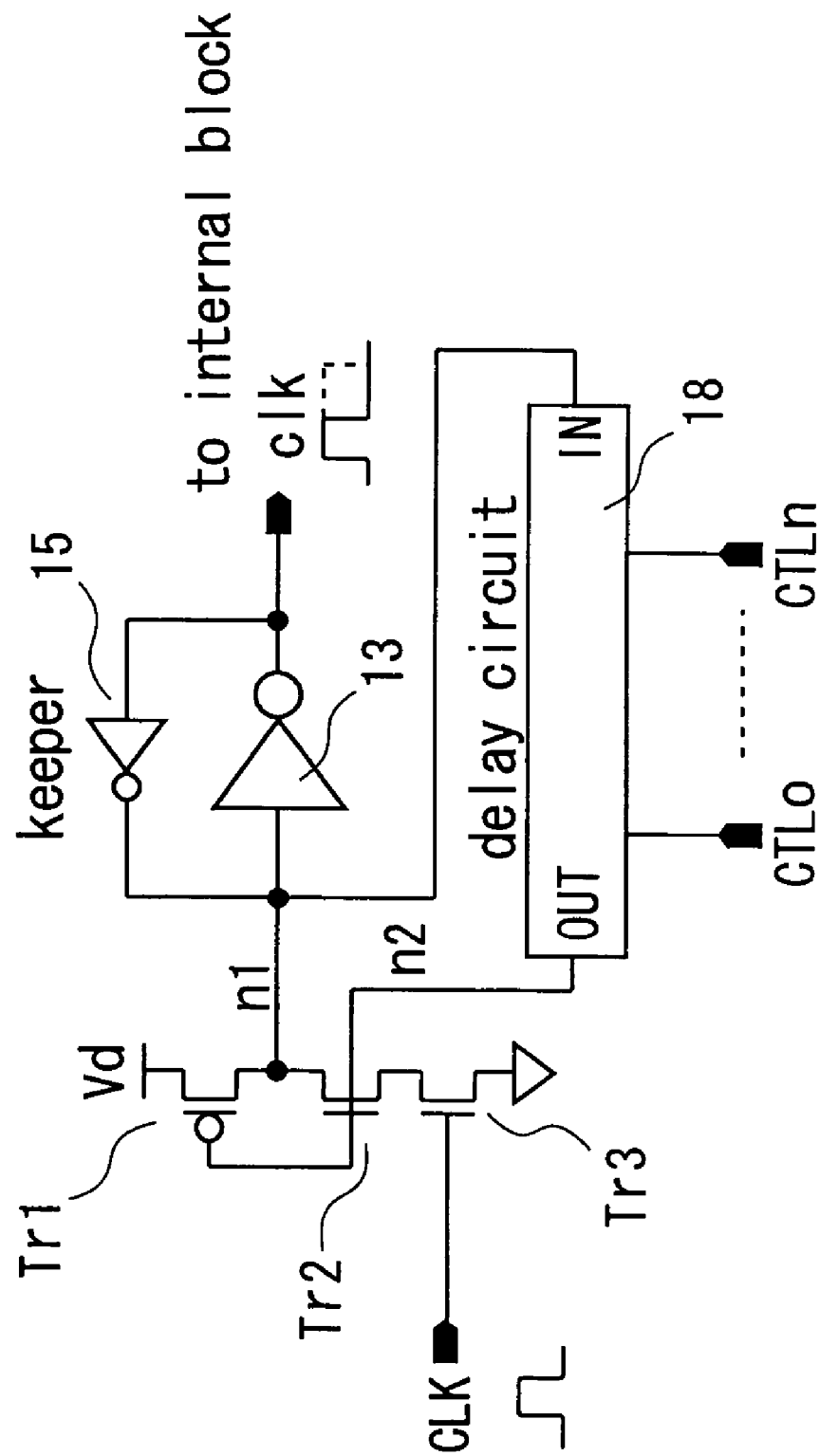
FIG. 10 is an explanatory diagram of the pulse generation circuit as a sixth embodiment of the present invention.

FIG. 10 is an explanatory diagram of the sixth embodiment. As shown in FIG. 10, in the pulse generation circuit 1 in the sixth embodiment, a delay circuit 18 is provided with n-pieces of taps CT1-CTn.

The delay circuit 18 changes the delay period depending on which tap among the taps CT1-CTn a control signal is inputted to.

Accordingly, the delay period can be selected by inputting the control signal to a desired tap among the taps CT1-CTn, and a period extending from the fall (#2) of the node n1 down to the fall (#4) of the node n2 shown in FIG. 3 is changed, thus enabling the generation of the output pulse signal having a desired pulse width.

Thus, according to the pulse generation circuit in the sixth embodiment, in addition to the effect of the first embodiment described above, the pulse width of the output pulse signal can be arbitrarily changed.

Seventh Embodiment

A seventh embodiment is different from the first embodiment discussed above in terms of feedback-controlling the delay period of the delay circuit by providing a control block, and other configurations are the same as those in the first embodiment. Therefore, the repetitive explanations are omitted in a way that marks the same components as those in the first embodiment discussed above with the same numerals and symbols.

Figure 11:
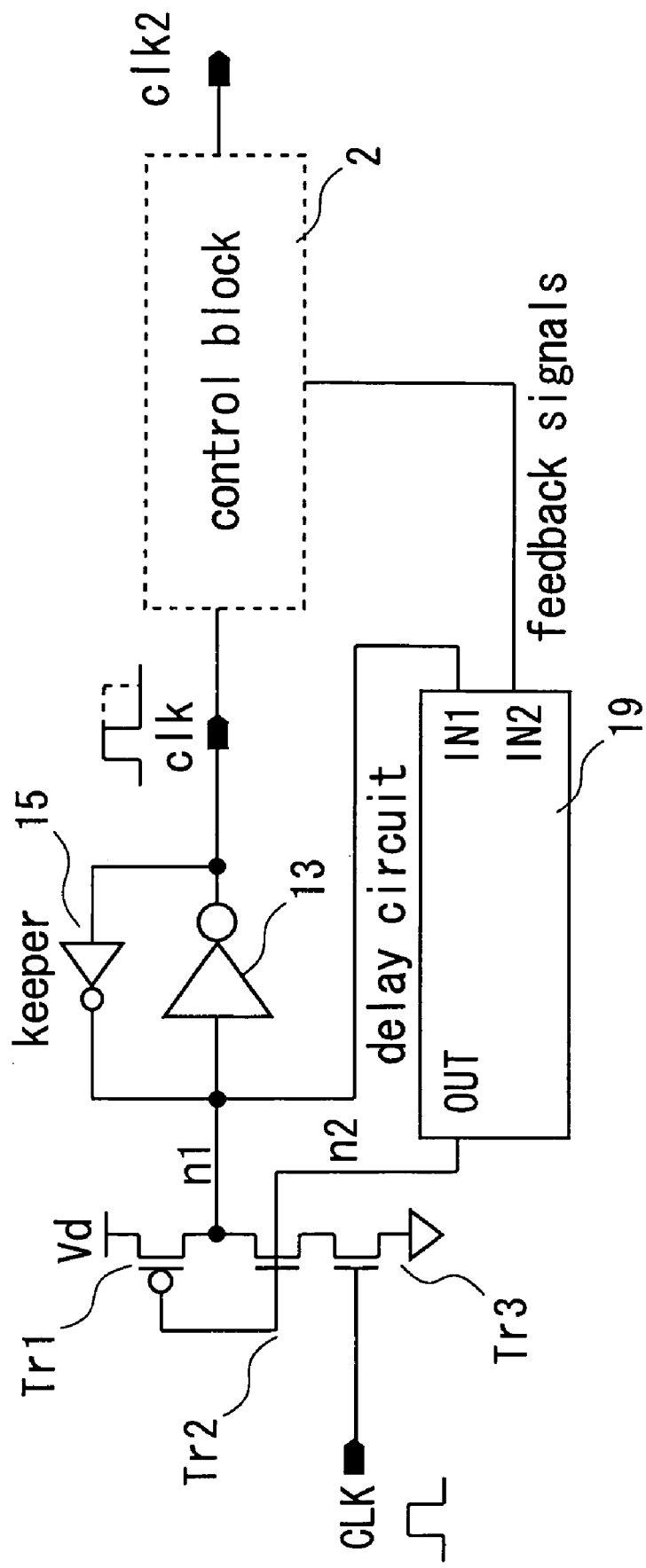
FIG. 11 is an explanatory diagram of the pulse generation circuit as a seventh embodiment of the present invention.

FIG. 11 is an explanatory diagram of the seventh embodiment. As illustrated in FIG. 11, the pulse generation circuit 1 in the seventh embodiment includes a control block 2, whereby a feedback signal is inputted to a delay circuit 19.

The control block 2, of which an input terminal is connected to the output line clk, outputs the pulse signal inputted from the output line clk to a circuit at a rear stage from an output line clk2, then judges whether the pulse width of the pulse signal is a predetermined pulse width or not, and, if not the predetermined pulse width, inputs a feedback signal to the delay circuit 19 so as to become the predetermined pulse width.

The delay circuit 19 changes the delay period depending on which tap among the taps CT1-CTn the control signal is inputted to, corresponding to the feedback signal.

To be specific, when the pulse width required by the posterior circuit is assumed to be Wx, the control block 2, if the pulse width of the pulse signal from the output line clk is shorter than the pulse width Wx, the feedback signal purporting that the delay period be elongated is inputted to the delay circuit 19. Then, whereas if the pulse width of the pulse signal from the output line clk is longer than the pulse width Wx, the feedback signal purporting that the delay period be shortened is inputted to the delay circuit 19. With this contrivance, the pulse widths of the output pulses from the output lines clk, clk2 can be each feedback-controlled to the predetermined pulse width.

Thus, according to the pulse generation circuit in the seventh embodiment, in addition to the effect of the first embodiment described above, the pulse width of the output pulse signal can be assured.

Eighth Embodiment

An eighth embodiment is different from the seventh embodiment described above in terms of providing the delay circuits with the taps, and other configurations are the same as those in the seventh embodiment. Therefore, the repetitive explanations are omitted in a way that marks the same components as those in the seventh embodiment discussed above with the same numerals and symbols.

Figure 12:
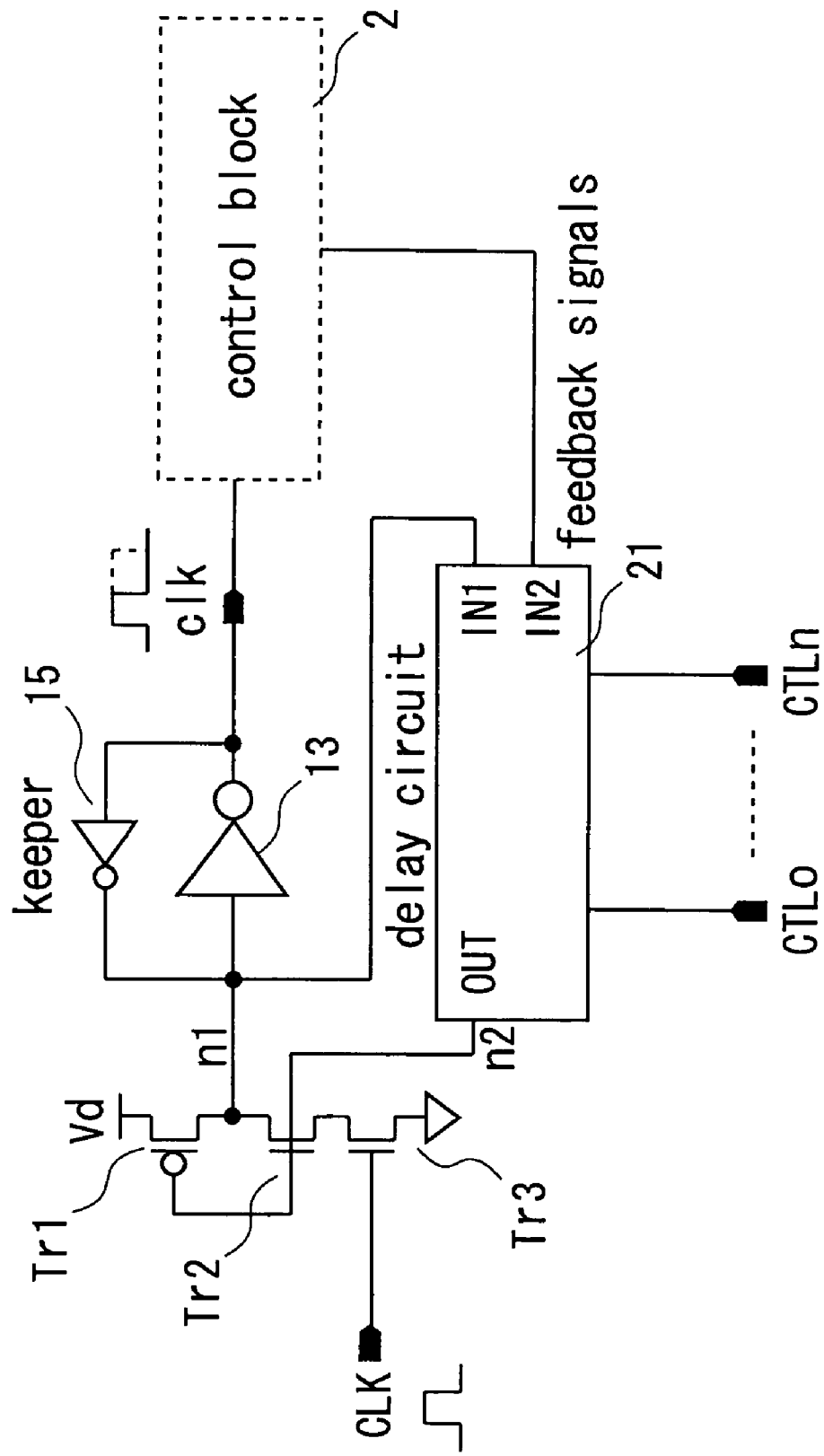
FIG. 12 is an explanatory diagram of the pulse generation circuit as an eighth embodiment of the present invention.

FIG. 12 is an explanatory diagram of the eighth embodiment. As illustrated in FIG. 12, in the pulse generation circuit 1 in the eighth embodiment, a delay circuit 21 is provided with n-pieces of taps CT1-CTn.

The delay circuit 18 changes the delay period depending on which tap among the taps CT1-CTn the control signal is inputted to.

The control block 2 receives information about the changed delay time from the delay circuit or from the circuit to which the control signal is transmitted, and may perform the feedback-control based on this delay time, and may also perform the feedback-control so as to approximate the closest pulse width in a way that previously sets the pulse widths corresponding to n-pieces of delay time to be selected by a delay circuit 21.

Thus, according to the pulse generation circuit in the eighth embodiment, in addition to the effect of the first embodiment discussed above, the pulse width of the output pulse signal can be arbitrarily changed, and this changed pulse width can be assured.

Ninth Embodiment

A ninth embodiment is different from the first embodiment described above in terms of providing an input unit for stopping the delay circuit, and other configurations are the same as those in the first embodiment. Therefore, the repetitive explanations are omitted in a way that marks the same components as those in the first embodiment discussed above with the same numerals and symbols.

Figure 13:
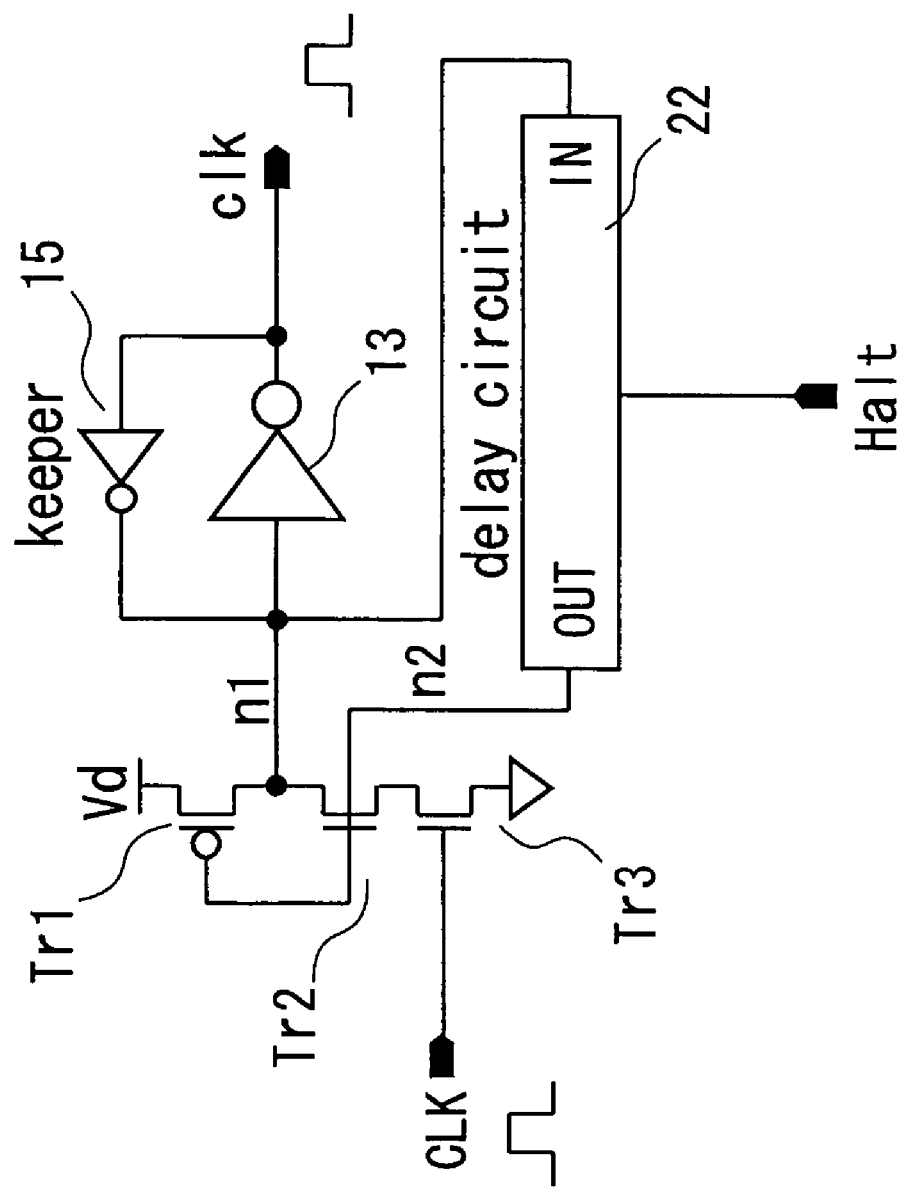
FIG. 13 is an explanatory diagram of the pulse generation circuit as a ninth embodiment of the present invention.

FIG. 13 is an explanatory diagram of the ninth embodiment. A delay circuit 22 in the ninth embodiment, when a stop signal is inputted, sets the output voltages at the Lo-levels, i.e., sets the voltage level of the node n2 and the voltage levels of the gate electrodes of the P-type MOS transistor Tr1 and of the first transistor Tr2 at the Lo-levels, and these voltage states are kept till a cancellation signal is inputted.

Hence, the node n1 is kept at the Hi-level, and the voltage level of the output line clk is fixed to the Lo-level.

Thus, according to the pulse generation circuit in the ninth embodiment, in addition to the effect of the first embodiment discussed above, even when the pulse signal is inputted to the input line CLK, the output of the pulse signal to the output line can be stopped.

Tenth Embodiment

A tenth embodiment is different from the first embodiment discussed above in terms of providing a gate circuit between the first N-type MOS transistor Tr2 and the output of the delay circuit 16, and other configurations are the same as those in the first embodiment. Therefore, the repetitive explanations are omitted in a way that marks the same components as those in the first embodiment discussed above with the same numerals and symbols.

Figure 15:
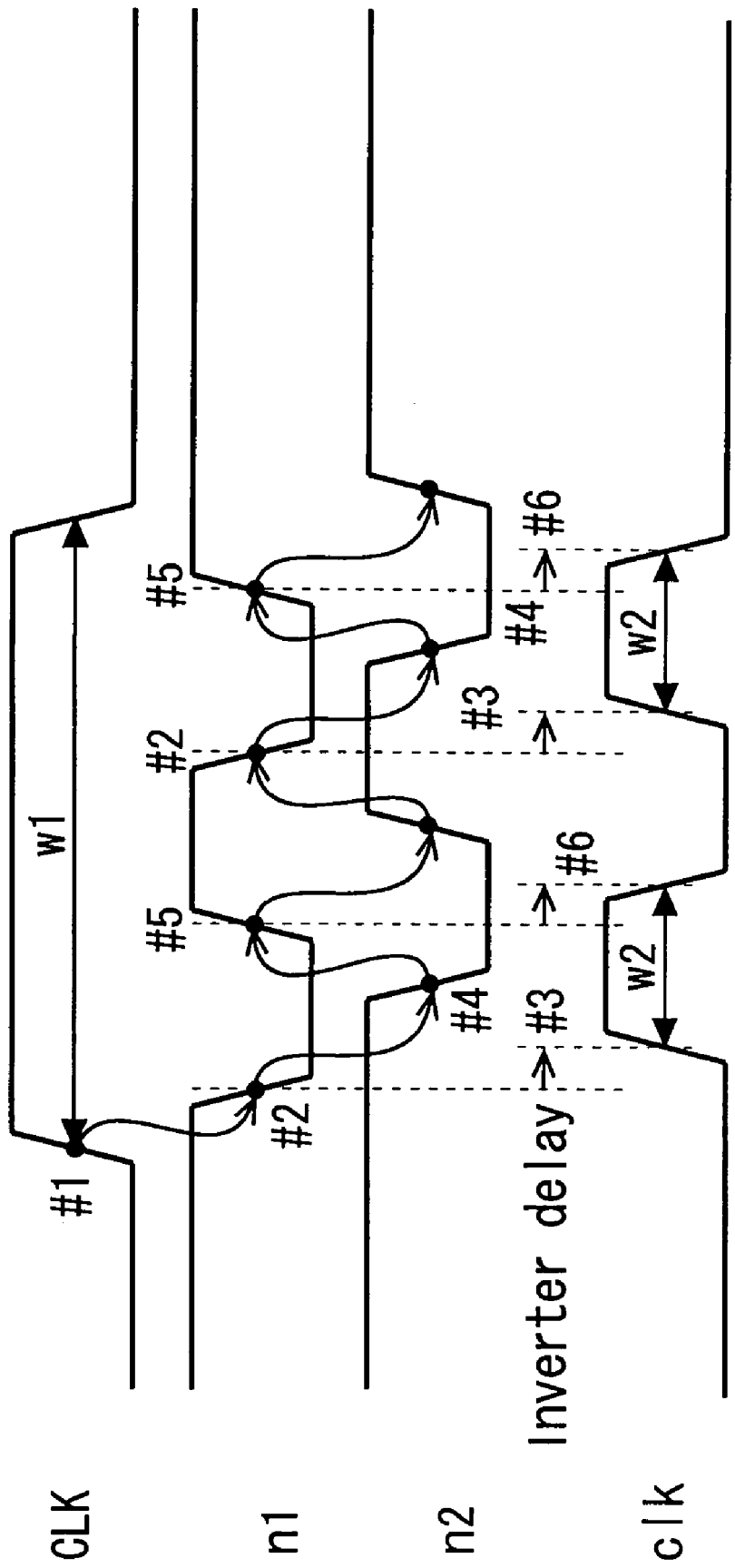
FIG. 15 is an explanatory diagram of the pulse generation circuit as a tenth embodiment of the present invention.

As shown in FIG. 15, if the delay time is too short (equal to or smaller than ½) for the pulse width of the input pulse signal, the node n2 becomes again the Hi-level while the input line CLK remains at the Hi-level, so that the node n1 falls and might oscillate.

Figure 14:
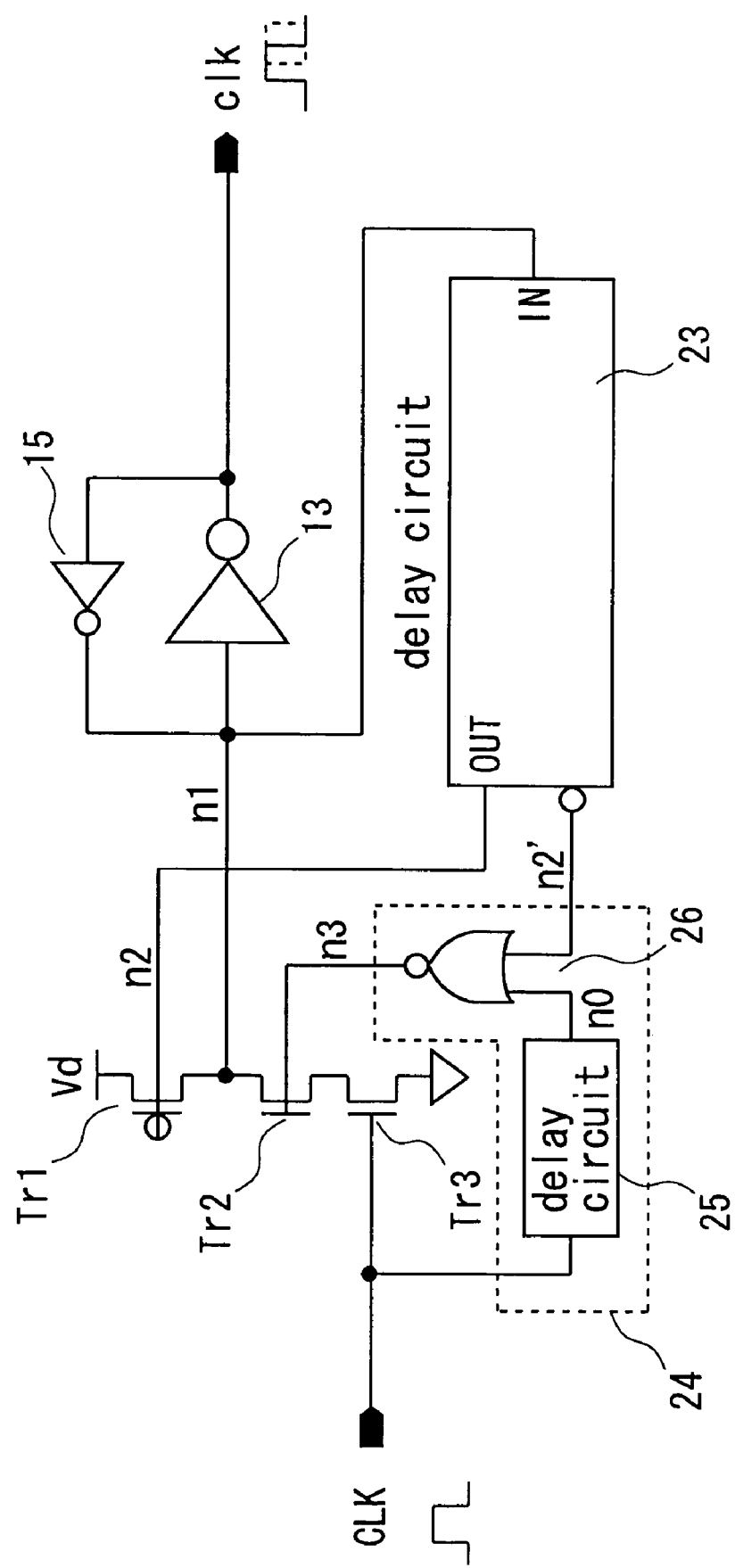
FIG. 14 is an explanatory diagram of an operation if a delay period is too short.

Hence, in the tenth embodiment, as shown in FIG. 14, a gate circuit 24 is provided between an output terminal of a delay circuit 23 and the gate electrode of the first N-type MOS transistor Tr2. The gate circuit 24 includes a chopping delay circuit 25 of which an input terminal is connected to the input line CLK, and a NOR circuit 26 of which an input terminal is connected respectively to an output terminal of the chopping delay circuit 25 and to the output terminal of the delay circuit 23, wherein NOR of a pulse signal into which the output of the delay circuit 23 is inverted and a pulse signal given from the chopping delay circuit 25, is inputted to the gate electrode of the first N-type MOS transistor Tr2.

Figure 16:
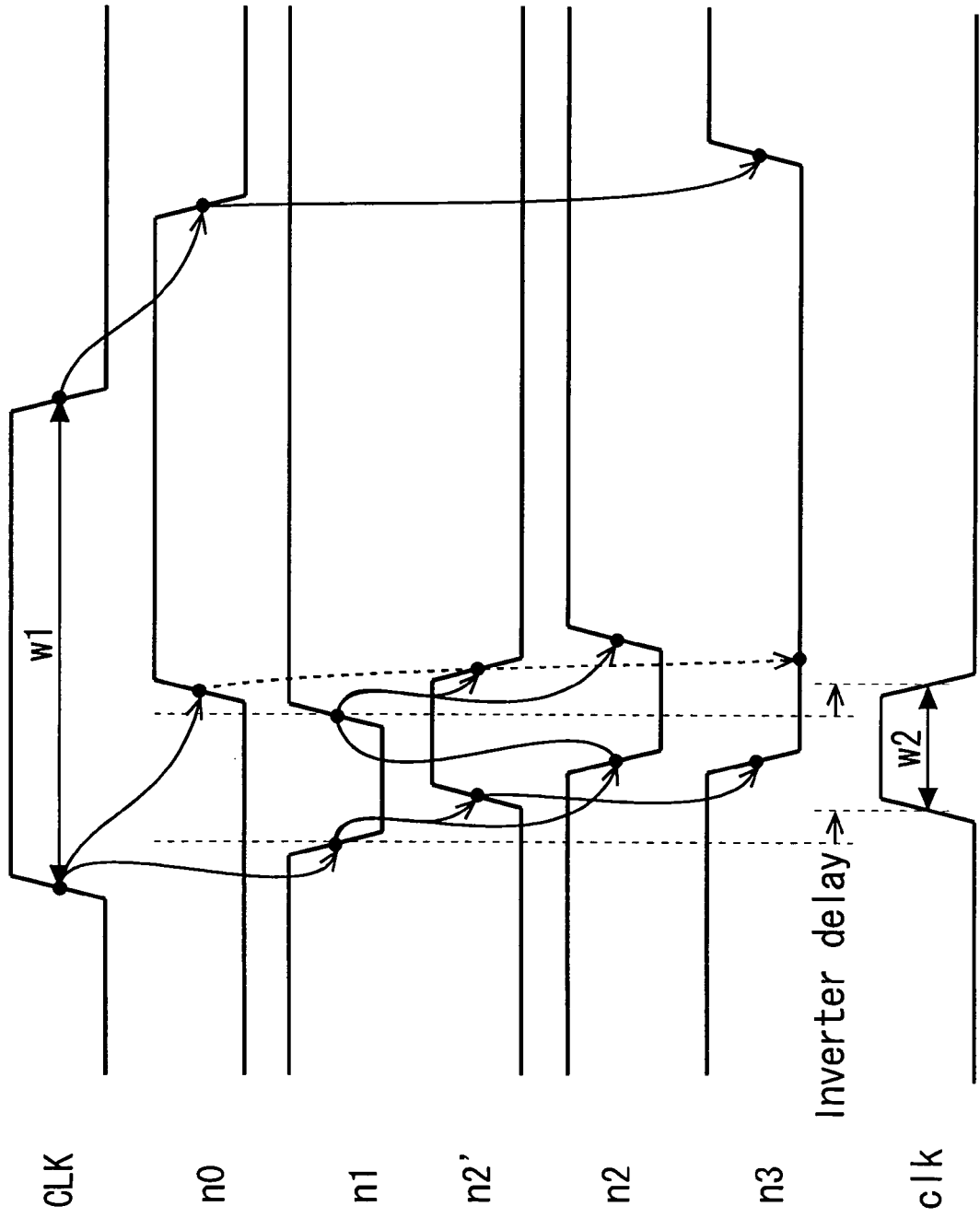
FIG. 16 is an explanatory diagram of an operation of the pulse generation circuit in the tenth embodiment.

With this configuration, as shown in FIG. 16, the voltage level of the node n3, i.e., the voltage level of the gate electrode of the first N-type MOS transistor Tr2, can be kept at the Lo-level while the input line remains at the Hi-level, and the oscillations are prevented.

Thus, according to the pulse generation circuit in the tenth embodiment, in addition to the effect of the first embodiment discussed above, even when the delay period of the delay circuit is equal to or smaller than the half of the pulse width of the input pulse signal, the oscillations can be prevented.

Other Embodiments

The embodiments discussed above may be carried out in a way that properly combine these embodiments. For example, the pulse generation circuit 1 in FIG. 1 is a combination of the eighth embodiment and the ninth embodiment.

Figure 17:
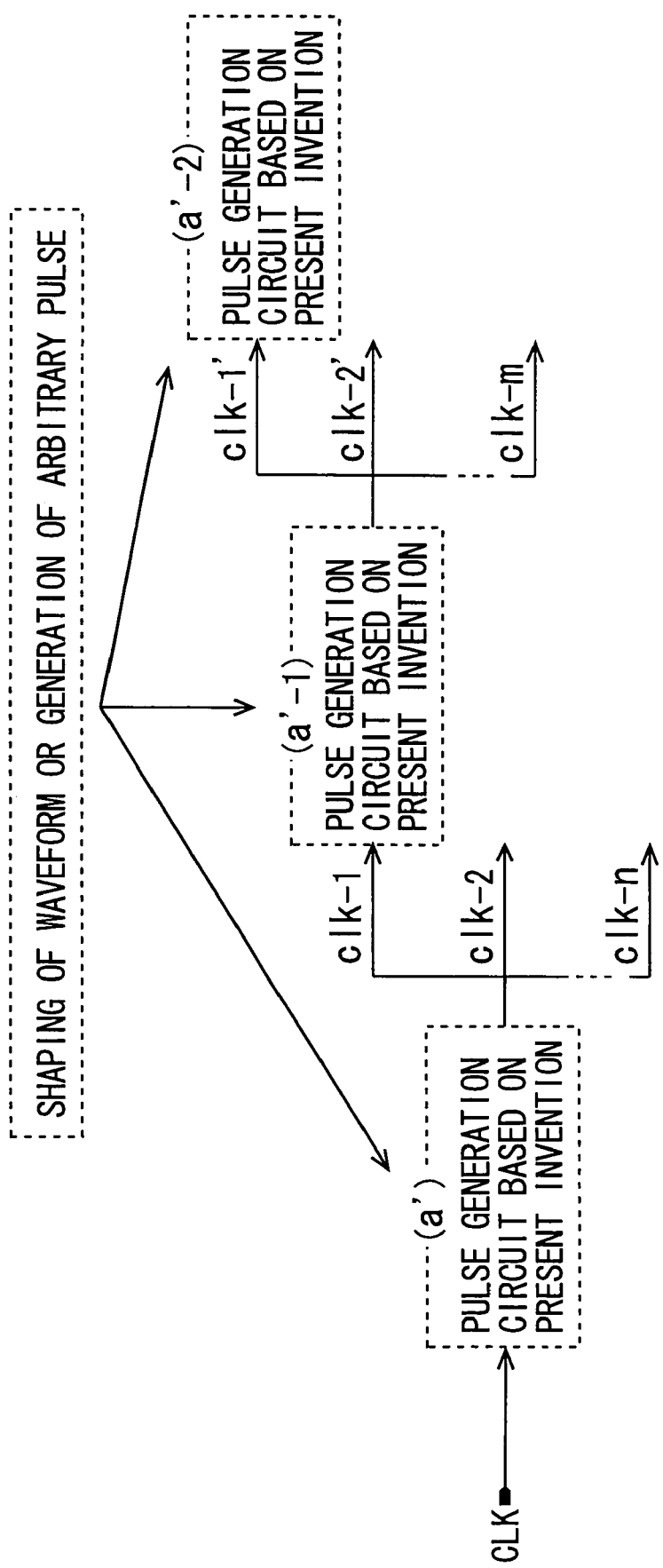
FIG. 17 is an explanatory diagram of the pulse generation circuit as other embodiment.

Further, a multi-staged configuration may also be taken, wherein the pulse generation circuits of the present invention are, as shown in FIG. 17, provided at multi-stages to obtain a variety of pulse signals.

INDUSTRIAL APPLICABILITY

As explained so far, according to the present invention, it is possible to provide the pulse generation circuit that is light in its input load and capable of self-resetting.

What is claimed is:

1. A pulse generation circuit comprising:
   a P-type MOS transistor having a gate electrode and a source electrode that is connected to a first power source line;
   a first N-type MOS transistor having a gate electrode and a drain electrode that is connected to a drain electrode of said P-type MOS transistor;
   a second N-type MOS transistor having a drain electrode that is connected to a source electrode of said first N-type MOS transistor, a gate electrode that is connected to only an input line to which an input pulse signal is inputted, and a source electrode that is connected to a second power source line;
   a delay circuit having an input terminal that is connected to the drain electrode of said P-type MOS transistor and to the drain electrode of said first N-type MOS transistor directly, and an output terminal that is connected to the gate electrode of said P-type MOS transistor and to the gate electrode of said first N-type MOS transistor, the delay circuit setting a delay-period arbitrarily;
   an inverter having an input terminal that is connected to the drain electrode of said P-type MOS transistor and to the drain electrode of said second N-type MOS transistor, and an output terminal that is connected to an output line to which a generated pulse is outputted; and
   a keeper keeping a voltage level of the line to which the input terminal of said inverter is connected,
   wherein when the input pulse signal is inputted to the input line, an output pulse having a pulse width corresponding to said delay period of said delay circuit is generated.

2. A pulse generation circuit comprising:
   a P-type MOS transistor having a gate electrode and a source electrode that is connected to a first power source line;
   a first N-type MOS transistor having a drain electrode that is connected to a drain electrode of said P-type MOS transistor, and a gate electrode that is connected to only an input line to which an input pulse signal is inputted;
   a second N-type MOS transistor having a gate electrode and a drain electrode that is connected to the drain electrode of said first N-type MOS transistor, and a source electrode that is connected to a second power source line;
   a delay circuit having an input terminal that is connected to the drain electrode of said P-type MOS transistor and to the drain electrode of said first N-type MOS transistor directly, and an output terminal that is connected to the gate electrode of said P-type MOS transistor and to the gate electrode of said second N-type MOS transistor, the delay circuit setting a delay-period arbitrarily;
   an inverter having an input terminal that is connected to the drain electrode of said P-type MOS transistor and to the drain electrode of said first N-type MOS transistor, and an output terminal that is connected to an output line to which a generated pulse is outputted; and
   a keeper keeping a voltage level of the line to which the input terminal of said inverter is connected,
   wherein when the input pulse signal is inputted to the input line, an output pulse having a pulse width corresponding to said delay of said delay circuit is generated.

3. A pulse generation circuit according to claim 1, wherein if the pulse width of the output pulse is shorter than the pulse width of the input pulse signal, said keeper functions as a high keeper.

4. A pulse generation circuit according to claim 1, wherein said delay circuit, of which the input terminal is connected via said inverter to the drain electrode of said P-type MOS transistor and to the drain electrode of said first N-typeMOS transistor, inverts the pulse input from the input terminal and outputs the inverted pulse to the gate electrode of said P-type MOS transistor and to the gate electrode of said first or second N-type MOS transistor to which the output terminal of the delay circuit is connected.

5. A pulse generation circuit according to claim 1, wherein said delay circuit includes at least one tap and adjusts a delay time based upon a control signal input via the tap.

6. A pulse generation circuit according to claim 1, wherein said delay circuit, when receiving a stop signal, stops the output of the output pulse in a way that keeps high (Hi) voltage levels of the gate electrodes of said P-type MOS transistor and of said first N-type MOS transistor.

7. A pulse generation circuit according to claim 1, wherein a gate circuit is provided between the output terminal of said delay circuit and the gate electrode of said first N-type MOS transistor, and
   said gate circuit includes a chopping delay circuit having an input terminal that is connected to the input line, and a NOR circuit having an input terminal that is connected respectively to an output terminal of said chopping delay circuit and to the output terminal of said delay circuit, and inputs NOR of a pulse signal into which the output of said delay circuit is inverted and a pulse signal from said chopping delay circuit to the gate electrode of said second N-type MOS transistor.

8. A pulse generation circuit according to claim 2, wherein a gate circuit is provided between the output terminal of said delay circuit and the gate electrode of said second N-type MOS transistor, and
   said gate circuit includes a chopping delay circuit having an input terminal that is connected to the input line, and a NOR circuit having an input terminal that is connected respectively to an output terminal of said chopping delay circuit and to the output terminal of said delay circuit, and inputs NOR of a pulse signal into which the output of said delay circuit is inverted and a pulse signal from said chopping delay circuit to the gate electrode of said first N-typeMOS transistor.

9. A pulse generation circuit according to claim 2, wherein if the pulse width of the output pulse is shorter than the pulse width of the input pulse signal, said keeper functions as a high keeper.

10. A pulse generation circuit according to claim 2, wherein said delay circuit, of which the input terminal is connected via said inverter to the drain electrode of said P-type MOS transistor and to the drain electrode of said first N-type MOS transistor, inverts the pulse inputted from the input terminal and outputs the inverted pulse to the gate electrode of said P-type MOS transistor and the gate electrode of said second N-type MOS transistor.

11. A pulse generation circuit comprising:
    a P-type MOS transistor having a gate electrode and a source electrode that is connected to a first power source line;
    a first N-type MOS transistor having a drain electrode that is connected to the drain electrode of said P-type MOS transistor;
    a second N-type MOS transistor having a drain electrode that is connected to a source electrode of said first N-type MOS transistor, and a source electrode that is connected to a second power source line;
    a delay circuit setting a delay period arbitrarily by having an input terminal that is connected to the drain electrode of said P-type MOS transistor and to the drain electrode of said first N-type MOS transistor directly, and an output terminal;

an inverter having an input terminal that is connected to the drain electrode of said P-type MOS transistor, and an output terminal that is connected to an output line to which a generated pulse is output; and a keeper keeping a voltage level of the line to which the input terminal of said inverter is connected, wherein the first N-type MOS transistor or the second N-type MOS transistor has a gate electrode connected to only an input line to which an input pulse signal is input, wherein when the input pulse signal is input to the gate electrode of the first N-type MOS transistor, the output terminal of the delay circuit is connected to the gate electrode of said P-type MOS transistor and to the gate electrode of said second N-type MOS transistor, and the input terminal of the inverter is also connected to the drain electrode of said first N-type MOS transistor, wherein when the input pulse signal is input to the gate electrode of the second N-type MOS transistor, the output terminal of the delay circuit is connected to the gate electrode of said P-type MOS transistor and to the gate electrode of said first N-type MOS transistor, and the input terminal of the inverter is also connected to the drain electrode of said first N-type MOS transistor, and wherein when the input pulse signal is input to the input line, an output pulse having a pulse width corresponding to said delay period of said delay circuit is generated.

* * * * *

UNITED STATES PATENT AND TRADEMARK OFFICE
CERTIFICATE OF CORRECTION

PATENT NO.         : 7,446,589 B2
APPLICATION NO. : 11/319729
DATED                 : November 4, 2008
INVENTOR(S)       : Kenji Ijitsu Page 1 of 1

It is certified that error appears in the above-identified patent and that said Letters Patent is hereby corrected as shown below:

Column 1, Line 6, after "Aug. 13, 2003," delete "now pending,".

Column 11, Line 41, change "the drain" to --a source--.

Column 11, Line 51, change "periodarbitrarily;" to --period arbitrarily;--.

Column 12, Line 2, change "N-typeMOS" to --N-type MOS--.

Column 12, Line 41, change "N-typeMOS" to --N-type MOS--.

Column 12, Line 59, change "the drain" to --a drain--.

Signed and Sealed this

Twenty-fourth Day of February, 2009

JOHN DOLL
*Acting Director of the United States Patent and Trademark Office*